(12) United States Patent
Ishii et al.

(10) Patent No.: US 7,557,005 B2
(45) Date of Patent: Jul. 7, 2009

(54) SEMICONDUCTOR DEVICE AND A METHOD OF MANUFACTURING THE SAME

(75) Inventors: Yasushi Ishii, Tokyo (JP); Takashi Hashimoto, Tokyo (JP); Yoshiyuki Kawashima, Tokyo (JP); Koichi Toba, Tokyo (JP); Satoru Machida, Tokyo (JP); Kozo Katayama, Tokyo (JP); Kentaro Saito, Tokyo (JP); Toshikazu Matsui, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 147 days.

(21) Appl. No.: 11/727,591

(22) Filed: Mar. 27, 2007

(65) Prior Publication Data

US 2007/0262382 A1 Nov. 15, 2007

(30) Foreign Application Priority Data

May 10, 2006 (JP) ............................. 2006-131208

(51) Int. Cl.
*H01L 21/336* (2006.01)
(52) U.S. Cl. ............................. 438/267; 257/E21.179
(58) Field of Classification Search ................ 438/264, 438/267, 197, 257–263; 257/314, 319, 288, 257/316; 365/185.09
See application file for complete search history.

(56) References Cited

U.S. PATENT DOCUMENTS 5,969,383 A * 10/1999 Chang et al. ................ 257/316

| | | | | |
|---|---|---|---|---|
| 7,326,616 B2 * | 2/2008 | Shukuri | ................ | 438/266 |
| 7,371,631 B2 * | 5/2008 | Sakai et al. | ................ | 438/201 |
| 2002/0197800 A1 * | 12/2002 | Hashimoto et al. | ........... | 438/266 |
| 2004/0185609 A1 * | 9/2004 | Okumura et al. | ............ | 438/199 |
| 2006/0003508 A1 | 1/2006 | Sakai et al. | | |
| 2006/0022259 A1 * | 2/2006 | Kobayashi et al. | ........... | 257/321 |
| 2006/0163678 A1 * | 7/2006 | Anezaki | ................ | 257/411 |
| 2006/0261398 A1 * | 11/2006 | Lee | ................ | 257/314 |

FOREIGN PATENT DOCUMENTS

| JP | 2003-218232 A | 7/2003 |
|---|---|---|
| JP | 2006-19373 A | 1/2006 |

* cited by examiner

*Primary Examiner*—Savitri Mulpuri
(74) *Attorney, Agent, or Firm*—Miles & Stockbridge P.C.

(57) ABSTRACT

In a semiconductor device which includes a split-gate type memory cell having a control gate and a memory gate, a low withstand voltage MISFET and a high withstand voltage MISFET, variations of the threshold voltage of the memory cell are suppressed. A gate insulating film of a control gate is thinner than a gate insulating film of a high withstand voltage MISFET, the control gate is thicker than a gate electrode 14 of the low withstand voltage MISFET and the ratio of thickness of a memory gate with respect to the gate length of the memory gate is larger than 1. The control gate and a gate electrode 15 are formed in a multilayer structure including an electrode material film 8A and an electrode material layer 8B, and the gate electrode 14 is a single layer structure formed at the same time as the electrode material film 8A of the control gate.

4 Claims, 21 Drawing Sheets

SEMICONDUCTOR DEVICE AND A METHOD OF MANUFACTURING THE SAME

CROSS-REFERENCE TO RELATED APPLICATIONS

The disclosure of Japanese Patent Application No. 2006-131208 filed on May 10, 2006 including the specification, drawings and abstract is incorporated herein by reference in its entirety.

BACKGROUND OF THE INVENTION

1. Field of the Invention

The invention related to a semiconductor device and a manufacturing technology of the same, particularly, relates to a technology which is effective when applied to manufacture of a semiconductor device including a nonvolatile memory and peripheral circuits thereof.

2. Description of the Related Art

As a kind of nonvolatile memory (Electrically Erasable and Programmable Read Only Memory) which can electrically rewrite data, a split-gate type memory cell structure using a charge storage layer including an ONO (Oxide Nitride Oxide) film is known.

As peripheral circuits of the nonvolatile memory, for example, circuits including a low withstand voltage MISFET such as a sense amplifier, a column decoder and a row decoder, and circuits including and a high withstand voltage MISFET such as a boosting circuit are known.

In Japanese Patent Application Laid-open No. 2006-019373 (Patent Document 1), a technology in a split-gate type MONOS nonvolatile memory including a control gate and a memory gate is disclosed, in which the memory gate includes a doped polycrystalline silicon film and the control gate includes a polycrystalline silicon film which is formed by ion-implanting an impurity into an undoped silicon film. In the above Patent Document 1, in addition to the MONOS-type nonvolatile memory, a low withstand voltage and a high withstand voltage MISFET which are included in peripheral circuits thereof are disclosed.

In addition, in Japanese Patent Application Laid-open No. 2003-218232 (Patent Document 2), in a semiconductor device including a low withstand voltage and a high withstand voltage MOSFET, a structure is disclosed, in which a film thickness (height) of a gate electrode of the low withstand voltage MOSFET differs from a film thickness (height) of a gate electrode of the high withstand voltage MOSFET.

A semiconductor device considered by the inventors includes, for example, a split-gate type memory cell including a control transistor and a memory transistor, such as one written in Japanese Patent Application Laid-open No. 2006-019373 (Patent Document 1), and a low withstand voltage and a high withstand voltage MISFET included in peripheral circuits thereof. FIG. 21 is a cross-sectional view schematically showing relevant parts of the semiconductor device considered by the inventors. In FIG. 21, a memory cell MC0 is shown at a memory array region, a low withstand voltage MISFET (Q10) is shown at a low withstand voltage MIS region in a peripheral circuit region, and a high withstand voltage MISFET (Q20) is shown at a high withstand voltage MIS region in the peripheral circuit region.

As shown in FIG. 21, the memory cell MC0 includes a control gate 8, a gate insulating film 6, a charge storage layer 16, a memory gate 9, and a sidewall spacer 12, n⁻type semiconductor regions 11d, 11s and n⁺type semiconductor regions 10d, 10s. The control gate 8 and the memory gate 9 form a split gate.

In the memory cell MC0, the control gate 8 is formed over a p-type well 2 in a principal surface of a semiconductor substrate 1 (hereinafter, referred to as a "substrate") made of a p-type single crystalline silicon substrate or the like through the gate insulating film 6. One part of the charge storage layer 16 is formed at one sidewall of the control gate 8 and the other part thereof is formed over the p-type well 2. The charge transfer layer 16 is an ONO (Oxide Nitride Oxide) film including two layers of silicon oxide films and a silicon nitride film sandwiched therebetween.

The memory gate 9 is formed at one sidewall of the control gate 8 and electrically separated from the control gate 8 through one part of the charge storage layer 16 as well as electrically separated from the p-type well 2 through the other part of the charge storage layer 16. The sidewall spacer 12 is formed at the other sidewall of the control gate 8 and at one sidewall of the memory gate 9, namely, it is the sidewall spacer of the split gate.

The n⁻type semiconductor region 11d is formed over the surface of the p-type well 2, one end of which is arranged in the vicinity of the control gate 8. The n⁺type semiconductor region 10d which has higher impurity concentration than the n⁻type semiconductor region 11d is formed over the surface of the p-type well 2, one end of which is arranged in the vicinity of the side wall spacer 12 at the side of the control gate 8. Additionally, the n⁻type semiconductor region 11s is formed over the surface of the p-type well 2, one end of which is arranged in the vicinity of the memory gate 9. The n⁺type semiconductor region 10s which has higher impurity concentration than the n⁻type semiconductor region 11s is formed over the surface of the p-type well 2, one end of which is arranged in the vicinity of the sidewall spacer 12 at the side of the memory gate 9.

The low withstand voltage MISFET (Q10) forming the peripheral circuit of the memory cell MC0 includes a gate electrode 14, the gate insulating film 6, the sidewall spacer 12, an n⁻type semiconductor region 17 and an n⁺type semiconductor region 26. The n⁻type semiconductor region 17 is formed over the surface of the p-type well 2, one end of which is arranged in the vicinity of the gate electrode 14. The n⁺type semiconductor region 26 is formed over the surface of the p-type well 2, one end of which is arranged in the vicinity of the sidewall spacer 12.

The high withstand voltage MISFET (Q20) forming the peripheral circuit of the memory cell MC0 includes a gate electrode 15, a gate insulating film 7, the sidewall spacer 12, an n⁻type semiconductor region 24 and an n⁺type semiconductor region 27. The n⁻type semiconductor region 24 is formed over the surface of the p-type well 2, one end of which is arranged in the vicinity of the gate electrode 15. The n⁺type semiconductor region 27 is formed over the surface of the p-type well 2, one end of which is arranged in the vicinity of the sidewall spacer 12.

A manufacturing technology of forming the control gate 8 of the memory cell MCO, the gate electrode 14 of the low withstand voltage MISFET (Q10), the gate electrode 15 of the high withstand voltage MISFET (Q20) is explained with reference to FIG. 22. FIG. 22 is a cross-sectional view schematically showing relevant parts of the semiconductor device considered by the inventors in a manufacturing process.

As shown in FIG. 22, the gate insulating films 6 and 7 made of a silicon oxide film or the like are formed over the surface of the p-type well 2 by thermally oxidizing the substrate 1 made of the silicon substrate or the like. Next, an electrode material film 8A made of an undoped silicon film or the like having a film thickness of approximately 250 nm is deposited over the substrate 1 by a CVD method. After that, ion implantation of an impurity (for example, phosphorous or arsenic) is performed to the electrode material film 8A which is the undoped silicon film to change the updoped silicon film into an n-type silicon film. The control gate 8 of the memory cell MC0, the gate electrode 14 of the low withstand voltage MISFET (Q10) and the gate electrode 15 of the high withstand voltage MISFET (Q20) are formed from the electrode material film 8A (refer to FIG. 21).

The gate electrode film 6 is formed at the memory array region and the low withstand voltage MIS region, and the gate insulating film 7 is formed at the high withstand voltage MIS region. That is, the gate insulating film 6 at the memory array region and the gate insulating film 6 at the low withstand voltage MIS region are the same film formed in the same process. The gate insulating film 7 is formed thicker in a film thickness (approximately 7 to 8 nm) than a film thickness of the gate insulating film 6 (approximately 3 to 4 nm) for securing withstand voltage. The electrode material film 8A is formed at the memory array region, the low withstand voltage MIS region and the high withstand voltage MIS region. That is, the electrode material films 8A in these regions are the same film formed in the same process.

The reason why the gate insulating film 6 under the control gate 8 and the gate electrode 14 is thinner than the gate insulating film 7 under the gate insulating film 15 is for operating transistors at high speed. The reason why the gate insulating film 7 under the gate electrode 15 is thicker than the gate insulating film 6 under the control gate 8 and the gate electrode 14 is for preventing dielectric breakdown even when high withstand voltage is applied.

It is necessary to make the gate electrode thinner in a film thickness as the gate electrode (gate length) is miniaturized, for securing the ratio (aspect ratio) of height (thickness) of the gate electrode for the gate length. In the semiconductor device considered by the inventors, the electrode material film 8A forming the control gate 8 of the memory cell MC0, the gate electrode 14 of the low withstand voltage MISFET (Q10) and the gate electrode 15 of the high withstand voltage MISFET (Q20) is formed in the same process, therefore, when the gate electrode is manufactured to be miniaturized (after the 90 nm generation), the whole electrode material film 8A is made to be thin in the film thickness. Therefore, for example, when the n⁻type semiconductor region 24 and an n⁺type semiconductor region 27 of the high withstand voltage MISFET (Q20) are formed, it is concerned that ions break through the gate electrode 15 (electrode material film 8A) of the high withstand voltage MISFET (Q20) which has been made thin, which causes deterioration and variations of characteristics of the high withstand voltage MISFET (Q20), lowering of reliability of the gate insulating film 7, lowering of hot carrier resistance and the like.

Consequently, as described in the Patent Document 2, it is considered that, in the high withstand voltage MISFET (Q20) as against the low withstand voltage MISFET (Q10), the gate electrode 15 which is thicker than the gate electrode 14 is formed, thereby preventing the implanted ions from breaking through the gate electrode 15 when forming the n⁻type semiconductor region 24 and the n⁺type semiconductor region 27. However, since the low withstand voltage MISFET (Q10) and the high withstand voltage MISFET (Q20) are semiconductor elements forming peripheral circuits of the memory cell MC0, it is concerned that deterioration of characteristics of the memory cell MC0 is caused by merely changing the film thickness of the gate electrode 14 with respect to the gate electrode 15.

For example, when the film thickness of the control gate 8 at the memory cell MC0 is made thin as the gate electrode (gate length) is miniaturized, there is a case in which the sidewall spacer 12 of the split gate does not function as a spacer. The sidewall spacer 12 is formed by etching back (anisotropic etching) an silicon oxide film deposited over the substrate 1 by the CVD method so as to cover the split gate including the control gate 8 and the memory gate 9. Consequently, the size (width) of the lower side of the sidewall spacer 12 in the gate-length direction along the substrate 1 is limited by the height of the split gate, that is, the thickness of the control gate 8, therefore, when the film thickness of the control gate 8 is made thin, there is a case that it is difficult to secure the width of the sidewall spacer 12 sufficiently. Accordingly, it is concerned that a problem of occurrence of junction leakage between the n⁺type semiconductor regions 10d, 10s formed by ion-implanting an impurity, using the split gate and the sidewall spacer 12 as masks, and the p-type well 2 forming the junction surface.

SUMMARY OF THE INVENTION

An object of the invention is to provide a technology capable of preventing occurrence of a problem in the nonvolatile memory.

The above and the other objects and novel characteristics of the invention will be clarified from description in the specification and the attached drawings.

A summary of a typical invention of inventions disclosed in the present application will be simply explained as follows.

In the split gate type memory cell including the control gate and the memory gate in the invention, the gate insulating film in the control gate is thinner than the gate insulating film at the high withstand voltage MISFET, the control gate is thicker than the gate electrode at the low withstand voltage MISFET and the ratio of thickness of the memory gate with respect to the gate length of the memory gate is larger than 1.

An advantage obtained by the typical invention of inventions disclosed in the application will be simply explained as follows.

According to the invention, occurrence of a problem in the nonvolatile memory can be prevented.

DESCRIPTION OF THE PREFERRED EMBODIMENTS

Hereinafter, an embodiment of the invention will be explained in detail with reference to the drawings. In all drawings for explaining the embodiment, the same numerals and signs are put to the same members in principle, and repeated explanations thereof are omitted.

Figure 1:
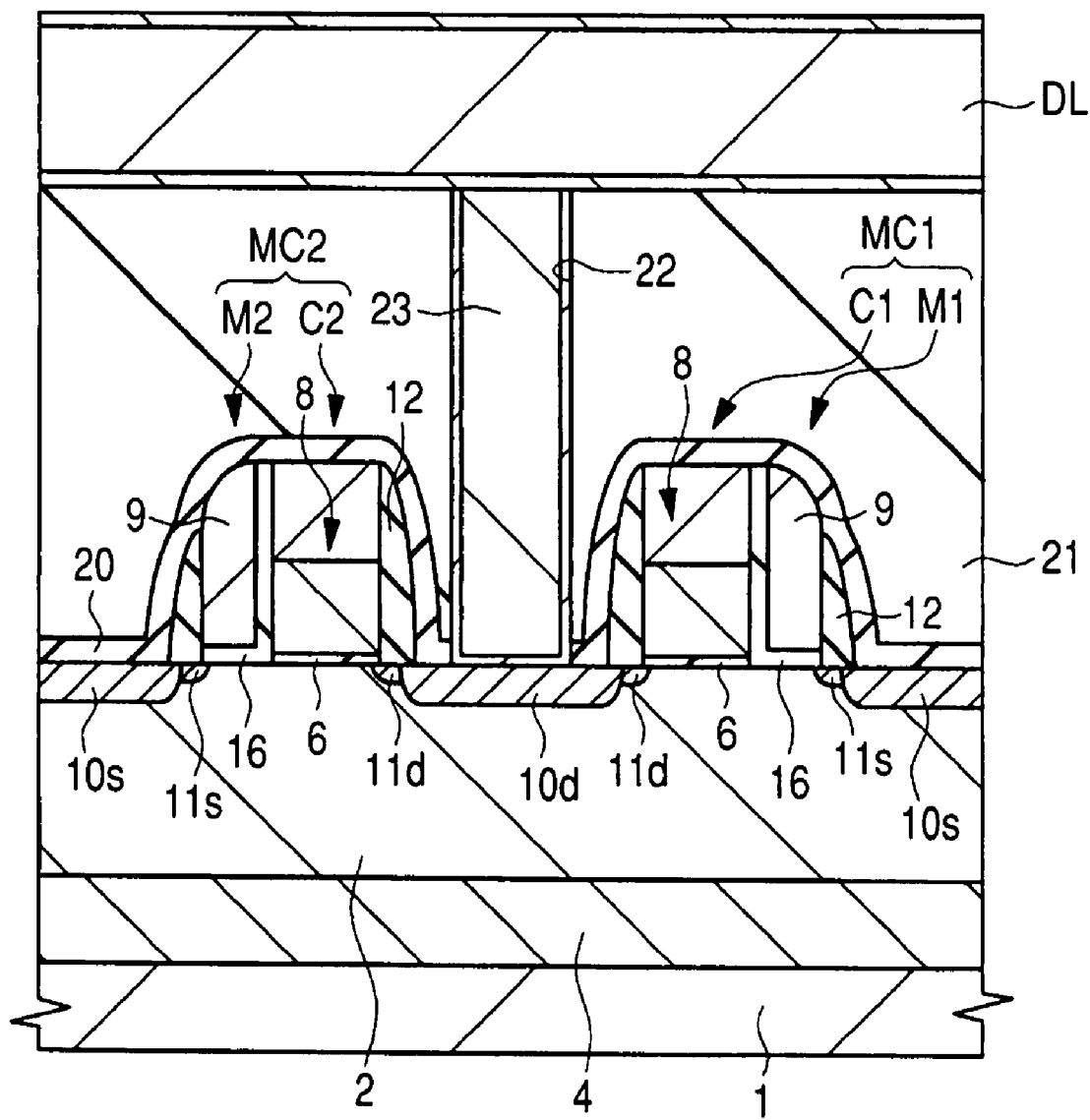
FIG. 1 is a cross-sectional view schematically showing relevant parts of a MONOS type nonvolatile memory according to an embodiment of the invention.
Figure 2:
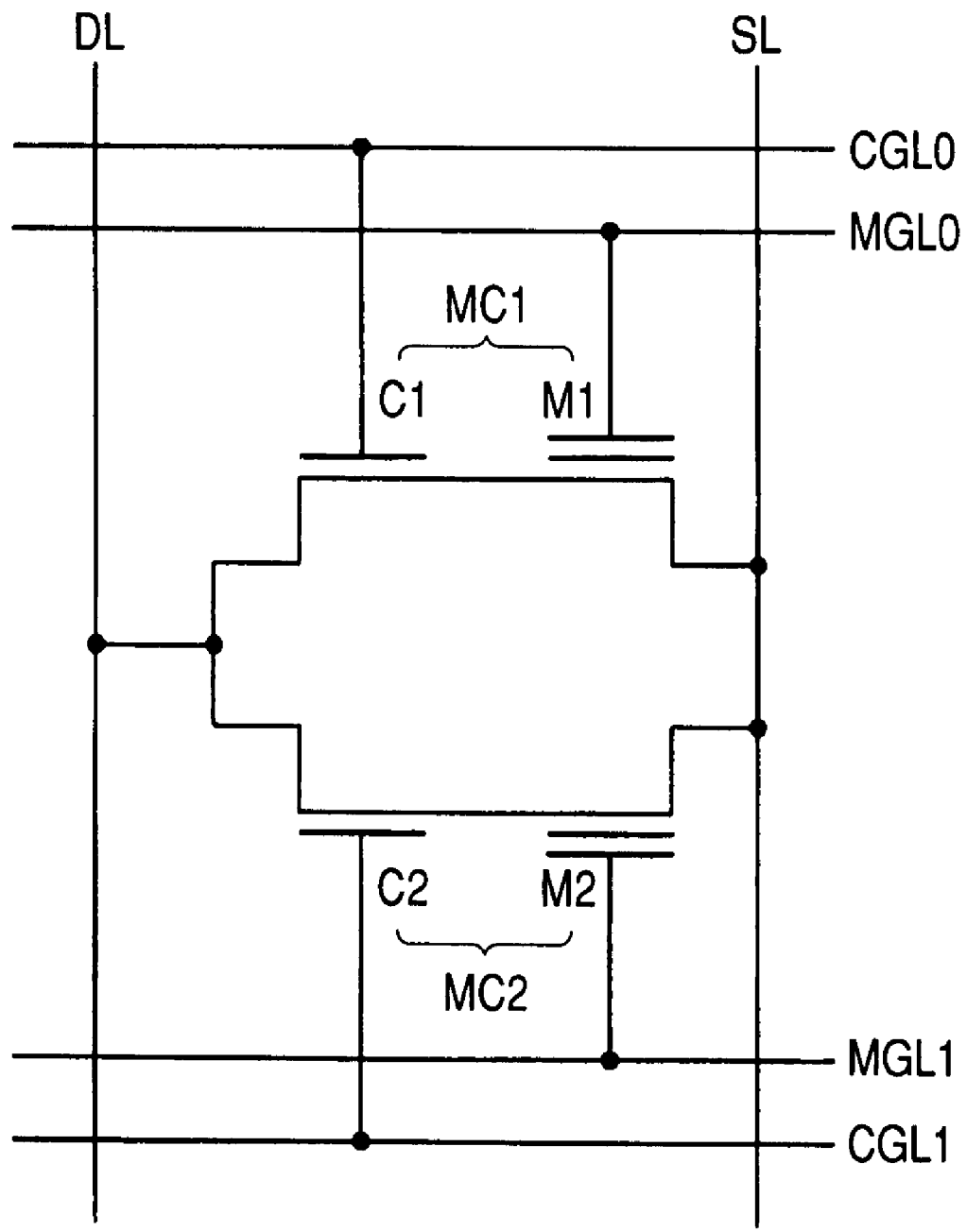
FIG. 2 is an equivalent circuit of the MONOS type nonvolatile memory shown in FIG. 1.

FIG. 1 is a cross-sectional view of relevant parts showing a MONOS (Metal Oxide Nitride Oxide Semiconductor) type nonvolatile memory according to the embodiment, FIG. 2 is an equivalent circuit diagram of the MONOS type nonvolatile memory shown in FIG. 1. FIG. 1 and FIG. 2 show two memory cells (MC1, MC2) arranged adjacent to each other.

The memory cell MC1 which is a MONOS type nonvolatile memory is formed at a p-type well 2 in a semiconductor substrate 1 (hereinafter, referred to as simply a "substrate") made of a p-type single crystalline silicon substrate or the like. The p-type well 2 is electrically separated from the substrate 1 through an n-type embedding layer 4 for well isolation, to which a desired voltage is applied.

The memory cell MC1 includes a control transistor C1 and a memory transistor M1. A gate electrode (control gate 8) of the control transistor C1 includes an n-type polycrystalline silicon film and formed over the gate insulating film 6 made of a silicon oxide film or the like. A gate electrode (memory gate 9) of the memory transistor M1 includes the n-type polycrystalline silicon film, which is arranged at one sidewall of the control gate 8. The memory gate 9 is electrically separated from the control gate 8 and the p-type well 2 through a charge storage layer 16 having an L-shape section in which one part thereof is formed at one sidewall of the control gate 8 and the other part thereof is formed over the p-type well 2. The charge storage layer 16 includes two layers of silicon oxide films and a silicon nitride film formed therebetween. When writing data, hot electrons generated at a channel region is injected into the charge storage layer 16 and captured at traps in the silicon nitride film.

An $n^+$ type semiconductor region 10d functioning as a drain region of the memory cell MC1 is formed in the p-type well 2 in the vicinity of the control gate 8. Also, an $n^+$ type semiconductor region 10s functioning as a source region of the memory cell MC1 is formed in the p-type well 2 in the vicinity of the memory gate 9.

An $n^-$ type semiconductor region 11d having lower impurity concentration than the $n^+$ type semiconductor region 10d is formed in the p-type well 2 at an area adjacent to the $n^+$ type semiconductor region (drain region) 10d. That is, the $n^-$ type semiconductor region 11d which is a low concentration diffusion layer and the $n^+$ type semiconductor region 10d which is a high concentration diffusion layer are formed. The $n^-$ type semiconductor region 11d is an extension region for alleviating a high electric field at an end portion of the $n^+$ type semiconductor region (drain region) 10d and allowing the control transistor C1 to be an LDD (Lightly Doped Drain) structure.

An $n^-$ type semiconductor region 11s having lower impurity concentration than the $n^+$ type semiconductor region 10s is formed in the p-type well 2 at an area adjacent to the $n^+$ type semiconductor region (source region) 10s. That is, the $n^-$ type semiconductor region 11s which is the low concentration diffusion layer and the $n^+$ type semiconductor region 10s which is the high concentration diffusion layer are formed. The $n^-$ type semiconductor region 11s is an extension region for alleviating a high electric field at an end portion of the $n^+$ type semiconductor region (source region) 10s and allowing the memory transistor M1 to be the LDD structure.

A sidewall spacer 12 including a silicon oxide film is formed at the other sidewall of the control gate 8 and at one sidewall of the memory gate 9. The sidewall spacer 12 is utilized for forming the $n^+$ type semiconductor region (drain region) 10d and $n^+$ type semiconductor region (source region) 10s.

A data line DL is formed above the memory cell MC1 configured as the above through a silicon nitride film 20 and a silicon oxide film 21. The data line DL is electrically coupled to the $n^+$ type semiconductor region (drain region) 10d through a plug 23 in a contact hole 22 formed above the $n^+$ type semiconductor region (drain region) 10d. The data line DL is made of a metal film including aluminum alloy as a principal component and the plug 23 is made of a metal film including tungsten as a principal component.

As shown in FIG. 2, the control gate 8 of the control transistor C1 is coupled to a control gate line CGL0, and the memory gate 9 of the memory transistor M1 is coupled to a memory gate line MGL0. The source region 10s is coupled to a source line SL, and a desired voltage is applied to the p-type well 2 from a not-shown power source line.

The memory cell MC2 adjacent to the memory cell MC1 is configured to be the same structure as the memory cell MC1, and the drain region 10d thereof is common to the drain region 10d of the memory cell MC1. As described above, the drain region 10d is coupled to the data line DL. The two memory cells MC1 and MC2 are arranged so as to be symmetric to each other, sandwiching the common drain region 10d. A control gate 8 of the control transistor C2 is coupled to a control gate line CGL1 and a memory gate 9 of the memory transistor M2 is coupled to a memory gate line MGL1. The source region 10s is coupled to the source line SL.

Sequentially, respective operations of writing, erasing and reading-out when the memory cell MC1 is a selected memory cell will be explained. In this case, to inject electrons into the charge storage layer 16 is defined as "writing" and to inject holes is defined as "erasing", respectively.

As a writing method, a hot electron writing method which is so-called source side injection method is adopted. At the time of writing, 0.7V is applied to the control gate 8, 10V is applied to the memory gate 9, 6V is applied to the source region 10s, 0V is applied to the drain region 10d and 0V is applied to the p-type well 2, respectively. Accordingly, hot electrons are generated in the vicinity of a middle region between the control gate 8 and the memory gate 9 in a channel region formed between the source region 10s and the drain region 10d, which are injected into the charge storage layer 16. The injected electrons are captured by traps in a silicon nitride film to increase the threshold voltage of the memory transistor M1.

As an erasing method, a hot-hole injection erase method utilizing channel current is adopted. At the time of erasing, 0.7V is applied to the control gate 8, −8V is applied to the memory gate 9, 7V is applied to the source region 10s, 0V is applied to the drain region 10d, and 0V is applied to the p-type well 2, respectively. Accordingly, a channel region is formed at the p-type well 2 below the control gate 8. Since the high voltage (7V) is applied to the source region 10s, a depletion layer extending from the source region 10s comes close to the channel region of the control transistor C1. As a result, impact ionization occurs with electrons flowing in the channel region being accelerated by the high electric field between the end portion of the channel region and the source region 10s to generate pairs of electrons and holes. The holes are accelerated by the negative voltage (−8V) applied to the memory gate 9 to be hot holes, which is injected to the charge storage layer 16. The injected holes are captured by traps in the silicon nitride film to decrease the threshold voltage of the memory transistor M1.

At the time of reading out, 1.5V is applied to the control gate 8, 1.5V is applied to the memory gate 9, 0V is applied to the source region 10s, 1.5V is applied to the drain region 10d and 0V is applied to the p-type well 2, respectively. That is to say, a voltage applied to the memory gate 9 is set between the threshold voltage of the memory transistor M1 in the writing state and the threshold voltage of the memory transistor M1 in the erasing state to discriminate between the writing state and the erasing state.

Next, a manufacturing method of the MONOS type nonvolatile memory will be explained with reference to FIG. 3 to FIG. 18 in order of process. As peripheral circuits of the MONOS type nonvolatile memory, for example, there are a sense amplifier, a column decoder, a row decoder, boosting circuit and the like. Consequently, a memory array region in which the memory cell is formed, a low withstand voltage MIS region in which a low withstand voltage MISFET is formed, a high withstand voltage MIS region in which a high withstand voltage MISFET is formed, a MIS region in which a MISFET whose source/drain regions are specified for the high withstand voltage and a capacitance region in which a MIS capacitance is formed.

Figure 3:
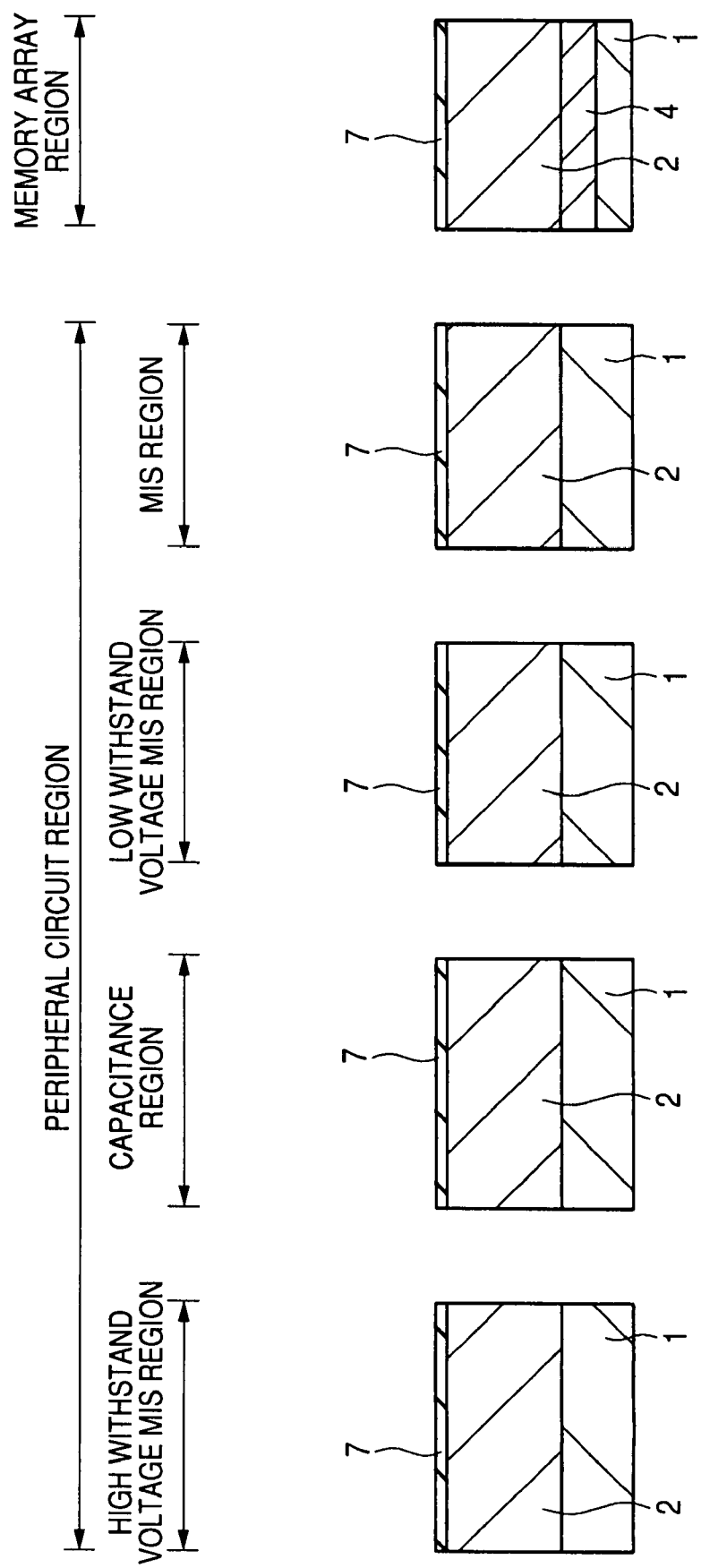
FIG. 3 is a cross-sectional view of relevant parts schematically showing a semiconductor device in a manufacturing process according to an embodiment of the invention.

First, as shown in FIG. 3, an n-type embedding layer 4 and a p-type well 2 are formed over a principal surface of a substrate 1 in the memory array region, and the p-type well 2 is formed over a principal surface of the substrate 1 in the peripheral circuits by using a well-known manufacturing method. Next, a gate insulating film 7 including silicon oxide is formed over the surface of the p-type well 2 by thermally oxidizing the substrate 1.

Figure 4:
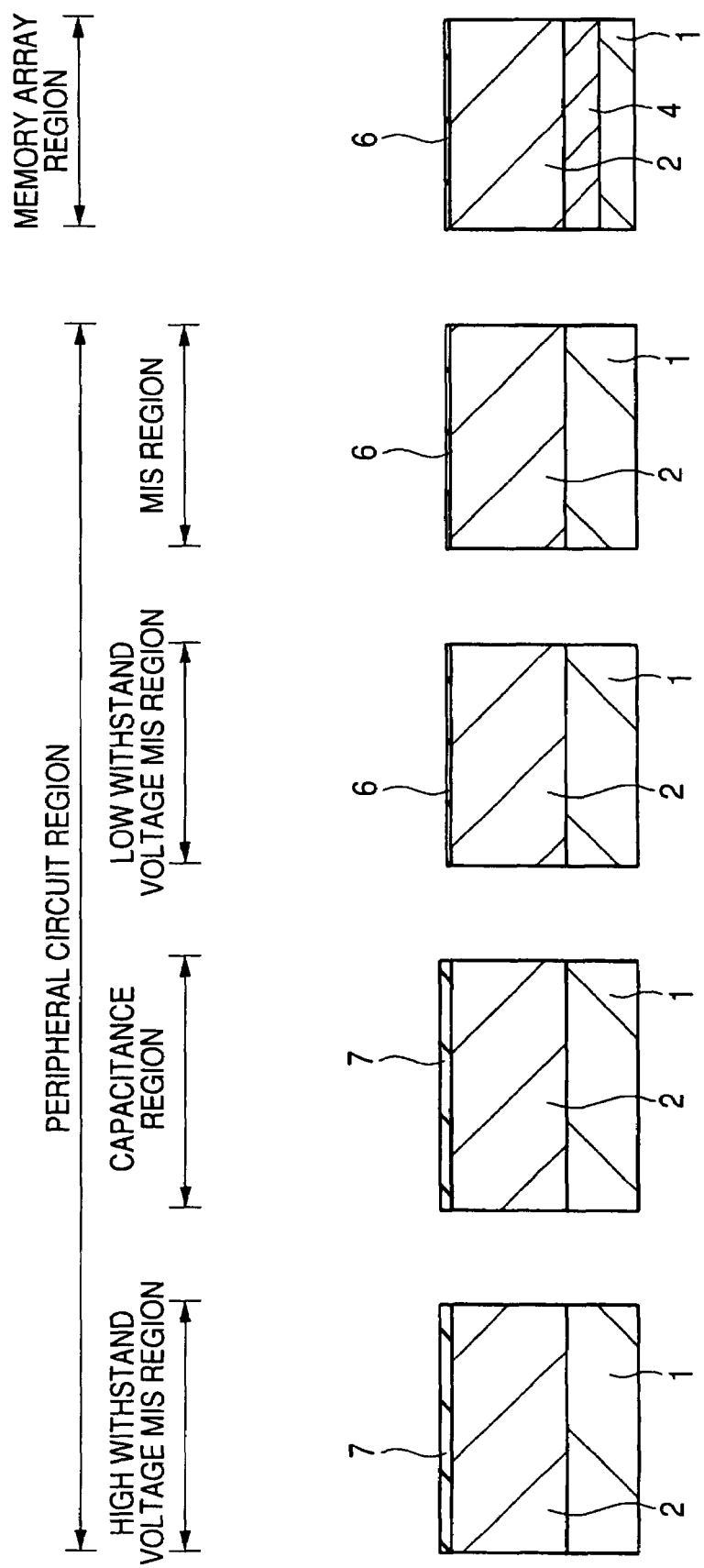
FIG. 4 is a cross-sectional view of relevant parts schematically showing the semiconductor device in a manufacturing process continued from FIG. 3.

Subsequently, as shown in FIG. 4, after the gate insulating film 7 in the memory array region, the low withstand voltage MIS region and the MIS region is removed by using a photolithography technology and an etching technology, a gate insulating film 6 including silicon oxide is formed over the p-type well 2 by thermally oxidizing the substrate 1. That is, the gate insulating film 6 is formed over the principal surface of the substrate 1 in the memory array region, the low withstand voltage MIS region and the MIS region as well as the gate insulating film 7 in the high withstand voltage MIS region and the capacitance region is thickened.

By repeating the processes of the gate insulating films (oxidation/removing processes described with reference to FIG. 3 and FIG. 4), gate insulating films having plural film thicknesses can be formed. In the embodiment, the gate insulating film 6 in the memory array region, the low withstand voltage MIS region and the MIS region is formed in the same process, a film thickness of which is approximately 3 to 4 nm. The gate insulating film 7 in the high withstand voltage MIS region and the capacitance region is formed in the same process, a film thickness of which is approximately 7 to 8 nm.

As described above, the gate insulating film 6 is formed in the memory array region, the low withstand voltage MIS region and the MIS region, and the gate insulating film 7 is formed in the high withstand voltage MIS region and the capacitance region. The gate insulating film 7 is formed to have a thicker film thickness (approximately 7 to 8 nm) than the film thickness (approximately 3 to 4 nm) of the gate insulating film 6 for securing withstand voltage. That is to say, the gate insulating film 6 in the memory array region and the gate insluting film 6 in the low withstand voltage MIS region are the same film formed in the same process. As described later, the gate insulating film 6 in the memory array region will be a gate insluting film of the control gate 8. Therefore, not the gate insulating film 7 in the high withstand voltage MISFET but the gate insulating film 6 in the low withstand voltage MISFET is allowed to be the gate insluting film of the control gate 8, which enables high-speed operation of the memory cell.

Figure 5:
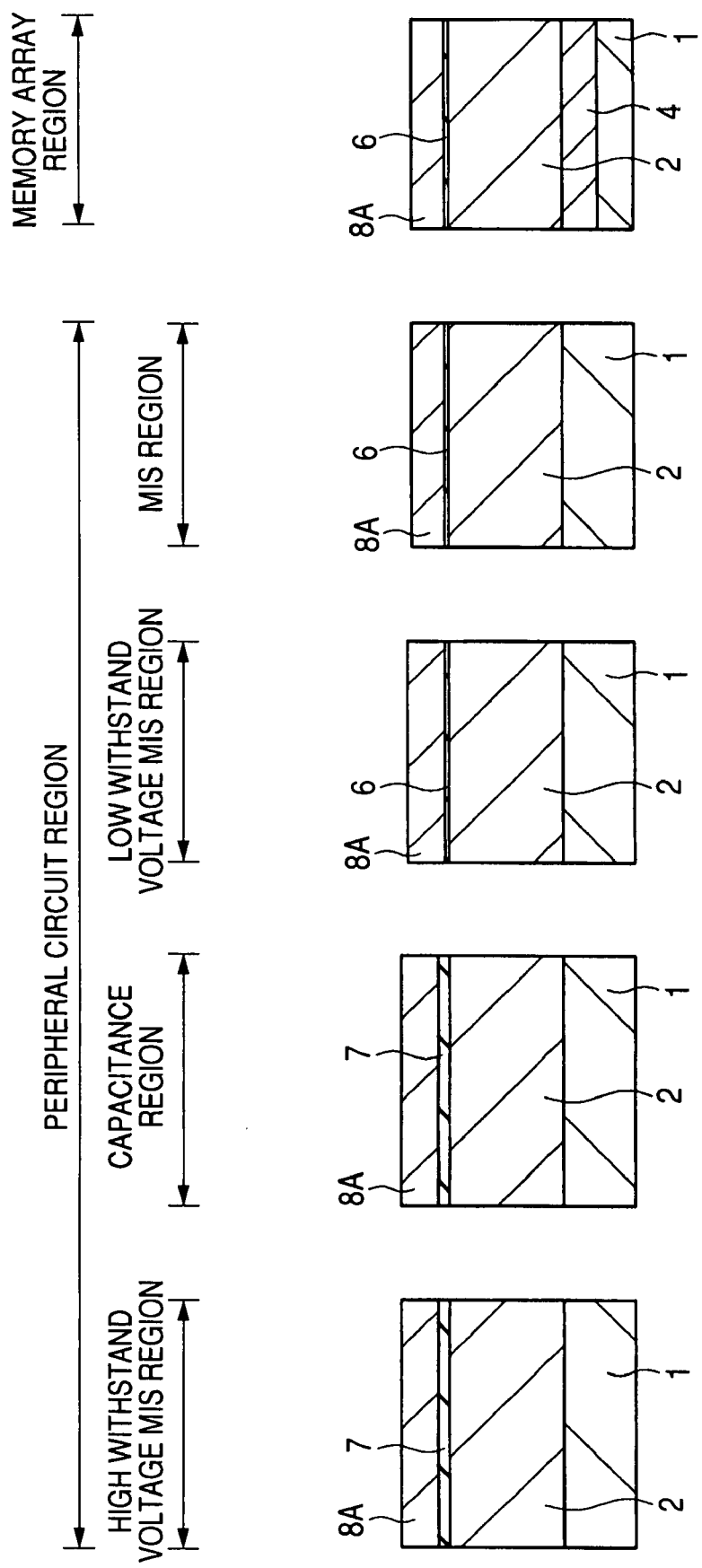
FIG. 5 is a cross-sectional view of relevant parts schematically showing the semiconductor device in a manufacturing process continued from FIG. 4.

Subsequently, as shown in FIG. 5, after an electrode material film 8A made of an undoped (impurity doping is not performed) silicon film having a film thickness of approximately 150 nm is deposited over the substrate 1 (the gate insulating film 6 and the gate insulating film 7) by the CVD method, a thin silicon oxide film (not shown) is deposited thereover for protecting the surface of the electrode material film 8A by the CVD method.

Subsequently, an impurity (phosphorous or arsenic) is ion-implanted into the electrode material film 8A, masking predetermined regions with a photoresist film by using the photolithography technology, thereby changing regions not masked in the electrode material film 8A made of the undoped silicon film to an impurity doped n-type silicon film. In the case that the impurity is phosphorous, the dose amount thereof is approximately $6 \times 10^{16}/cm^2$.

Figure 6:
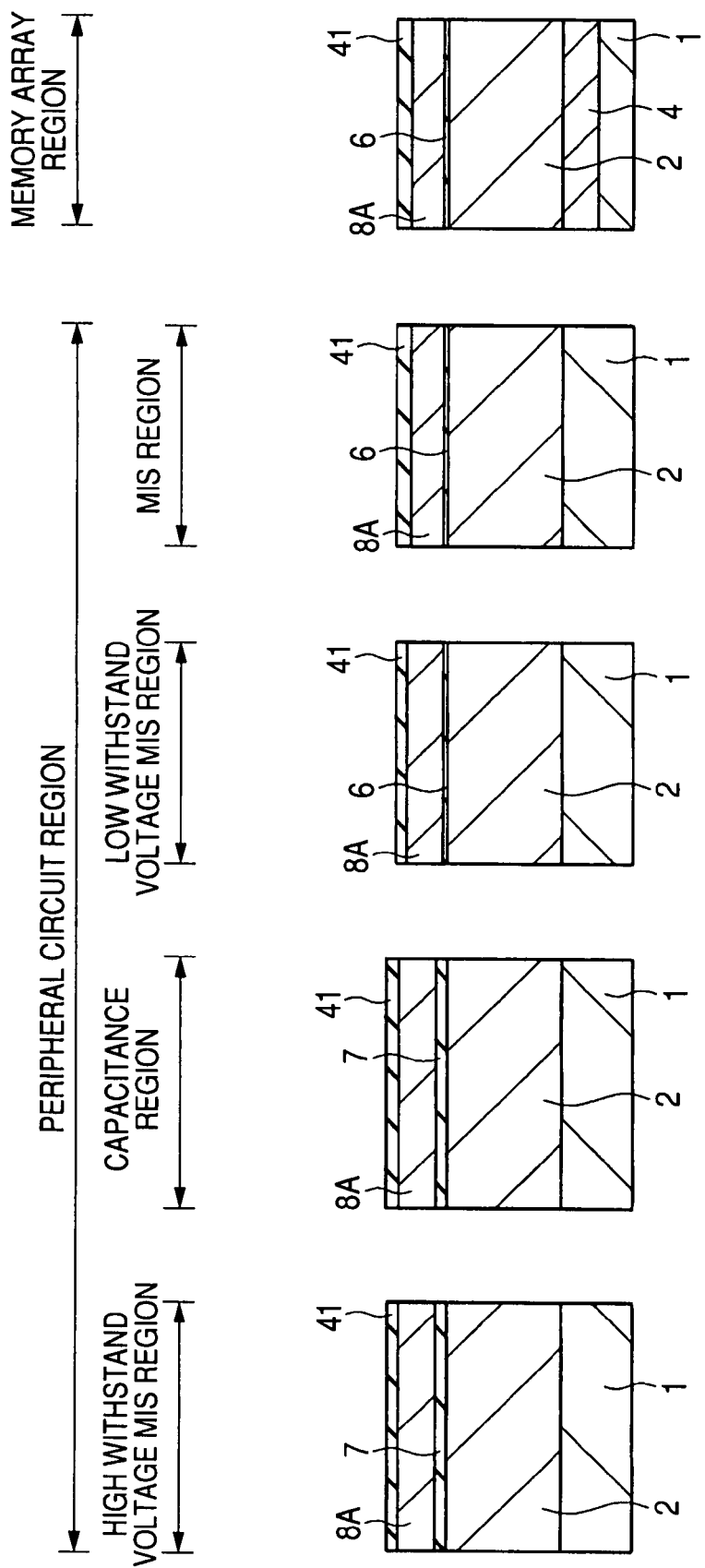
FIG. 6 is a cross-sectional view of relevant parts schematically showing the semiconductor device in a manufacturing process continued from FIG. 5.

Subsequently, as shown in FIG. 6, a cap insulating film 41 made of the silicon oxide film or the like for gate processing is deposited over the electrode material film 8A by a CVD method.

Figure 7:
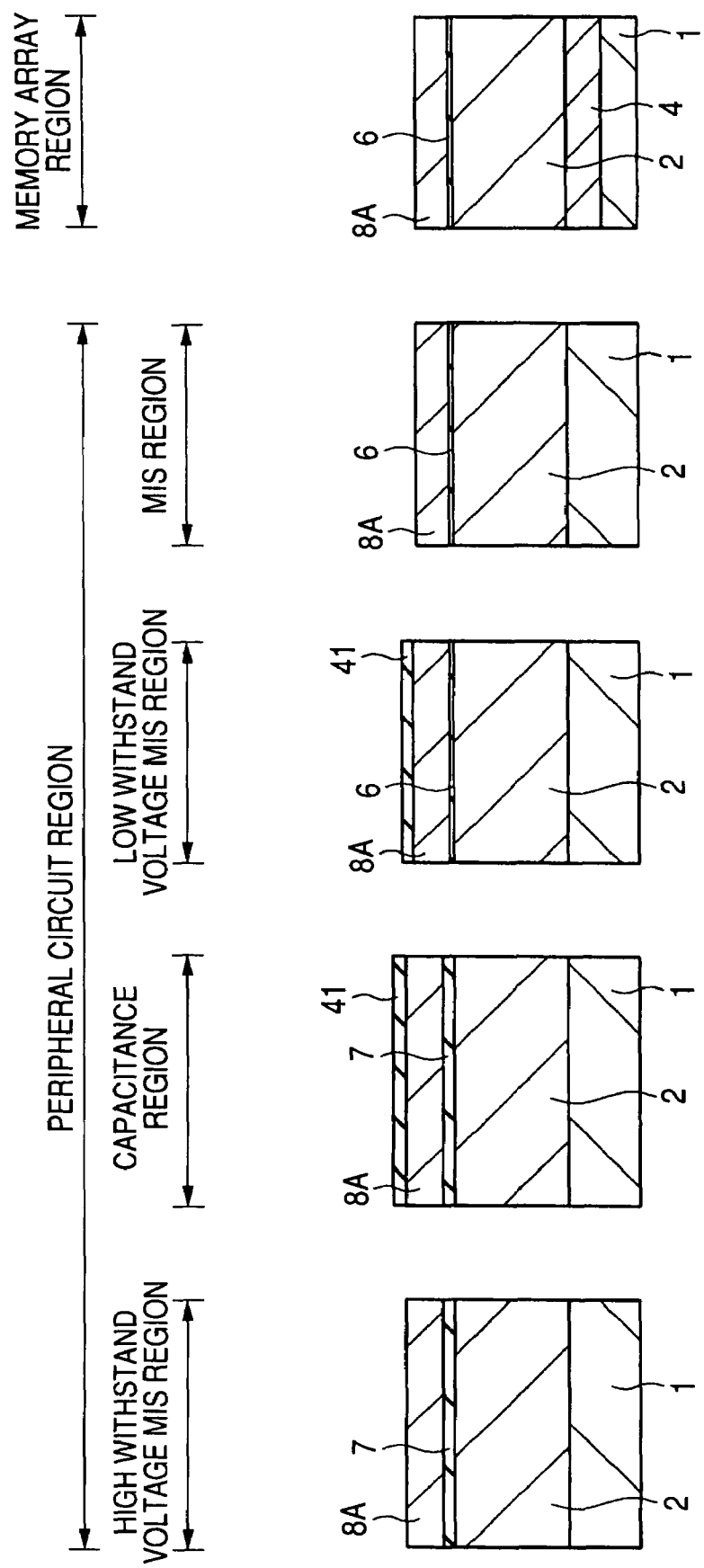
FIG. 7 is a cross-sectional view of relevant parts schematically showing the semiconductor device in a manufacturing process continued from FIG. 6.

Subsequently, as shown in FIG. 7, the cap insulating film 41 in the memory array region, the high withstand voltage MIS region and the MIS region is removed by using a photolithography technology and an etching technology, allowing the cap insulating film 41 to remain in the low withstand voltage MIS region and the capacitance region.

Figure 8:
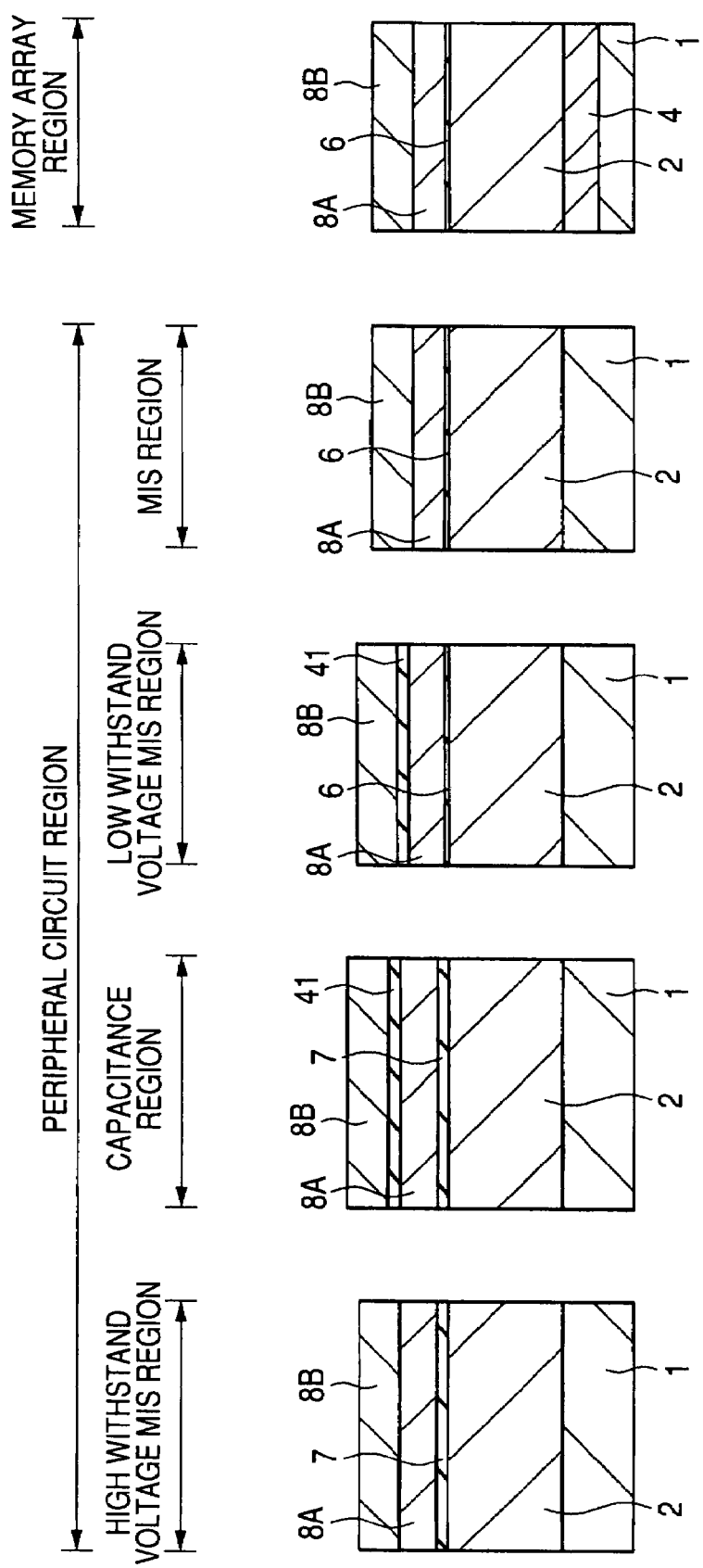
FIG. 8 is a cross-sectional view of relevant parts schematically showing the semiconductor device in a manufacturing process continued from FIG. 7.

Subsequently, as shown in FIG. 8, an electrode material film 8B made of an undoped silicon film having a film thickness of approximately 100 nm is deposited over the electrode material film 8A to cover the cap insulating film 41 by the CVD method. After that, the electrode material film 8B made of the undoped silicon film is changed to the n-type silicon film. Though it may be performed in the same manner that the electrode material film 8A including the undoped silicon film is changed to the n-type silicon film, in the embodiment, the change is performed by ion implantation of an impurity into the substrate 1 when forming semiconductor regions (extension regions and source/drain regions) as described later.

Figure 9:
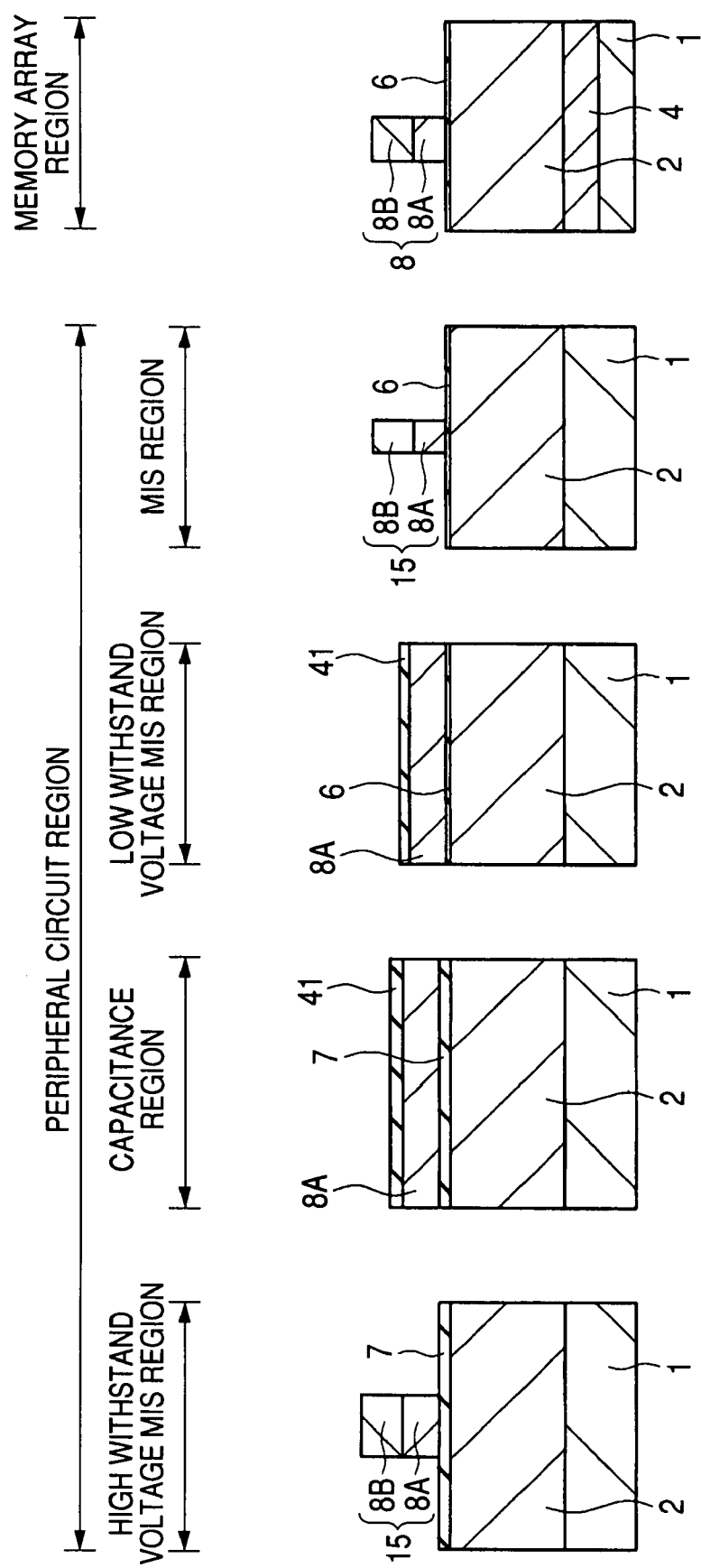
FIG. 9 is a cross-sectional view of relevant parts schematically showing the semiconductor device in a manufacturing process continued from FIG. 8.

Subsequently, as shown in FIG. 9, the electrode material film 8B and the electrode material film 8A are patterned (dry etching) using the photolithography technology and the etching technology, while protecting the electrode material film 8A in the low withstand voltage MIS region and the capacitance region with the cap insulating film 41. Accordingly, a control gate 8 including the electrode material film 8B which is the undoped silicon film and the electrode material film 8A which is the n-type silicon film is formed in the memory array region. Gate electrodes 15 including the electrode material film 8B which is the undoped silicon film and the electrode material film 8A which is the n-type silicon film are formed in the high withstand voltage MIS region and the MIS region. In a gate processing condition of the process, the cap insulating film 41 can not be removed, therefore, the electrode material film 8A in the low withstand voltage MIS region and the capacitance region remains in a self-aligning manner.

An impurity is ion-implanted into the control gate 8 and the gate electrodes 15 including the electrode material film 8B which is the undoped silicon film at a later process to allow the electrode material film 8B to be an n-type silicon film. Consequently, since the control gate 8 in the memory cell and the gate electrodes 15 in the peripheral circuits can be formed at the same time using the undoped silicon film, the gate forming process can be simplified.

The gate length of the control gate 8 formed in the memory array region is approximately 180 nm. When the gate length of the control gate 8 is short to approximately 180 nm, an aspect ratio (a ratio of height (thickness) of the control gate 8 with respect to the gate length)) is larger than 1. Accordingly, a memory gate 9 having the gate length smaller than the control gate 8 can be formed at a sidewall of the control gate 8.

Figure 10:
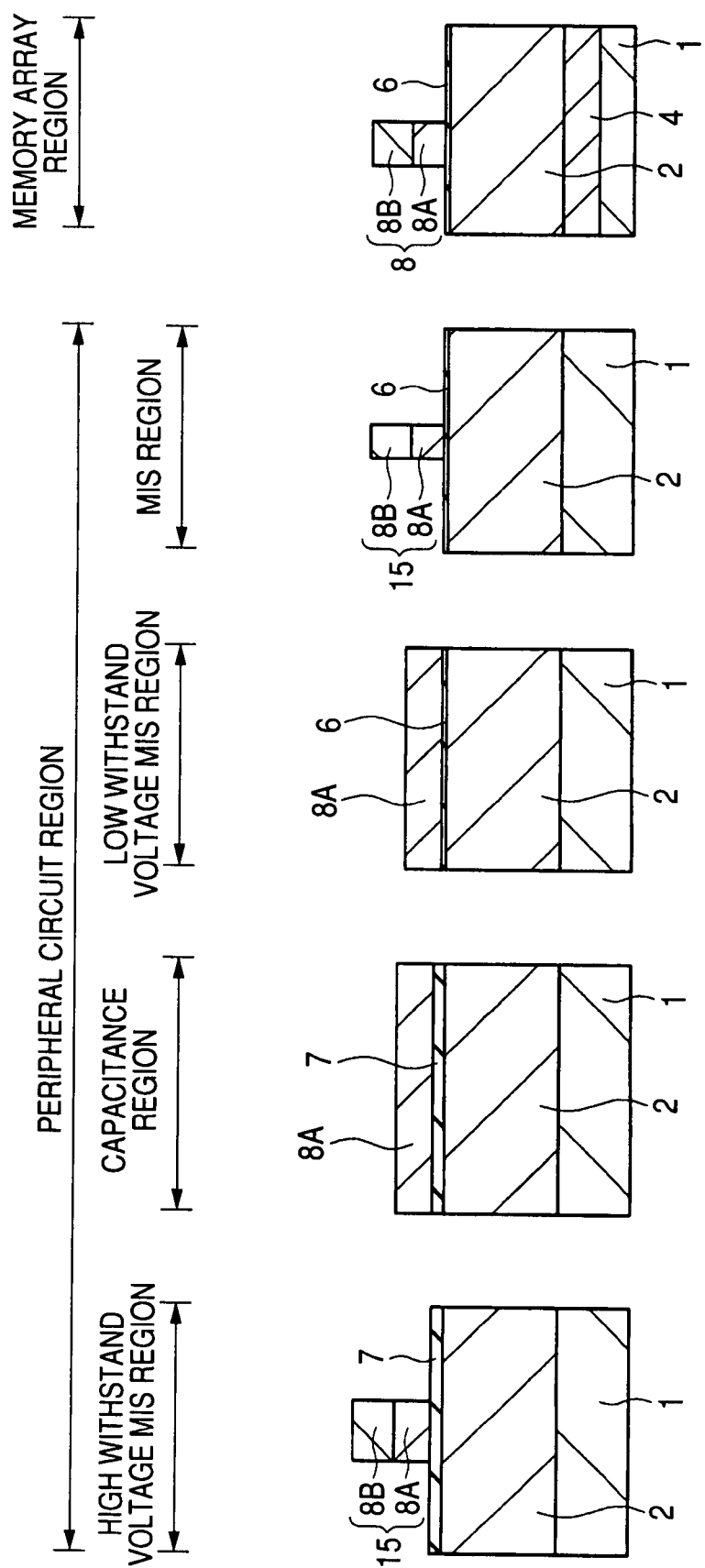
FIG. 10 is a cross-sectional view of relevant parts schematically showing the semiconductor device in a manufacturing process continued from FIG. 9.

Subsequently, the cap insulating film 41 in the low withstand voltage MIS region and the capacitance region is removed as shown in FIG. 10.

Figure 11:
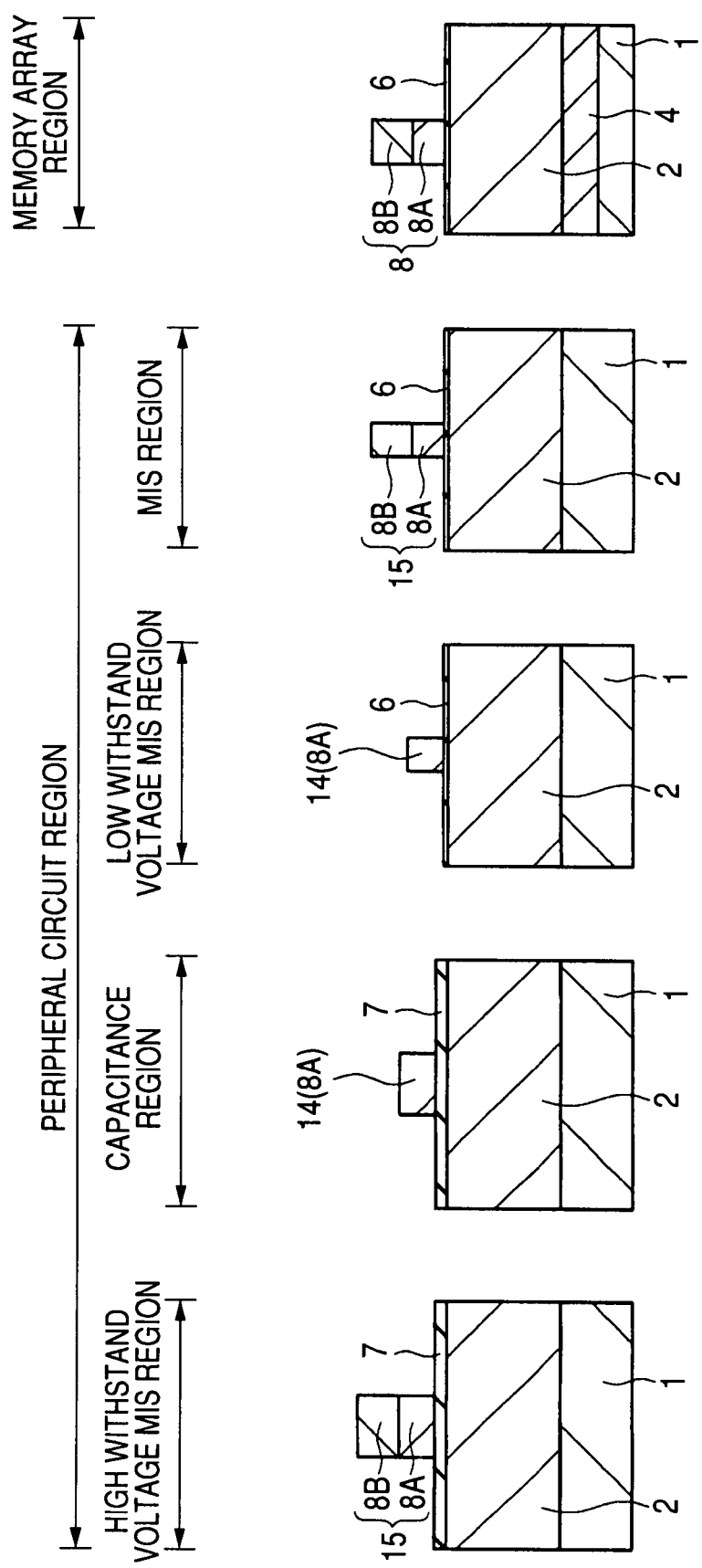
FIG. 11 is a cross-sectional view of relevant parts schematically showing the semiconductor device in a manufacturing process continued from FIG. 10.

Subsequently, the electrode material film 8B and the electrode material film 8A are patterned (dry etching) using the photolithography technology and the etching technology as shown in FIG. 11. Accordingly, gate electrodes 14 including the electrode material film 8A which is the n-type silicon film is formed in the low withstand voltage MIS region and the capacitance region.

By repeating the processes of gates (processes explained with reference to FIG. 6 to FIG. 11), gate electrodes having plural heights (film thicknesses) can be formed. In the embodiment, the control gate 8 in the memory array region and the gate electrodes 15 in the high withstand voltage MIS region and the MIS region are formed in a stacked structure of the electrode material film 8A and the electrode material film 8B, a film thickness (height) of which is approximately 250 nm. The gate electrodes 14 in the low withstand voltage MIS region and the capacitance region are formed in a single layer structure of the electrode material film 8A, a film thickness of which is approximately 150 nm.

Figure 12:
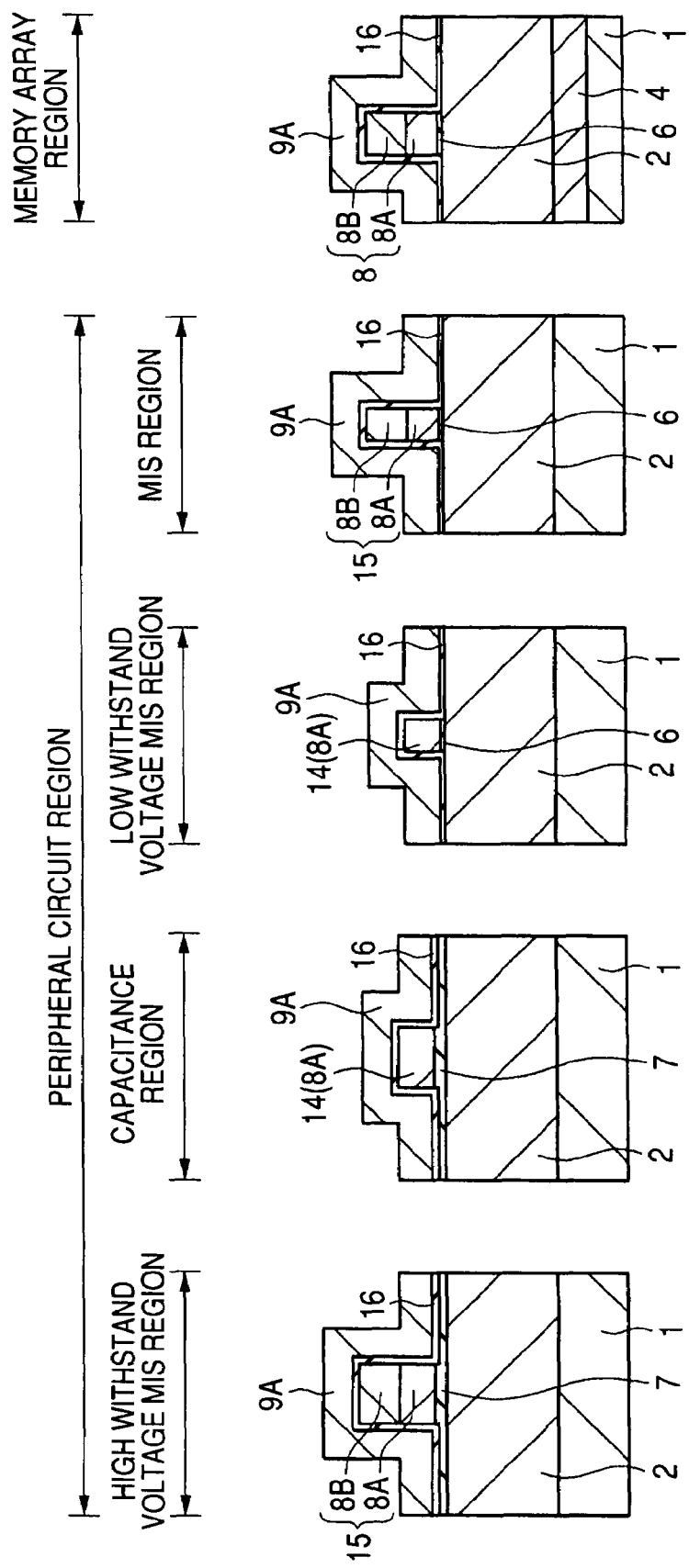
FIG. 12 is a cross-sectional view of relevant parts schematically showing the semiconductor device in a manufacturing process continued from FIG. 11.

Subsequently, as shown in FIG. 12, unnecessary gate insulating film 6 in the memory array region, the low withstand voltage MIS region and the MIS region is removed, allowing the gate insulating film 6 to remain under the control gate 8 of the memory array region, under the gate electrode 14 of the low withstand voltage MIS region and under the gate electrode 15 of the MIS region by patterning.

Next, a charge storage layer 16 is formed over the substrate 1. That is, the charge storage layer 16 is formed so as to cover the principal surface of the substrate 1 and sidewalls and a top surface of the control gate 8.

The charge storage layer 16 is formed by an ONO (Oxide Nitride Oxide) film including three layers of a silicon oxide film, a silicon nitride film and a silicon oxide film. The silicon oxide film at the lower layer of these three layers is formed by a thermal oxidation method or a CVD method. It is also preferable that the film is formed using an ISSG (In situ Steam Generation) oxidation method in which hydrogen and oxygen are introduced into a chamber of a thermal oxidation apparatus to perform radical oxidation reaction over a heated wafer. The silicon nitride film is formed by the CVD method or an ALD (atomic layer deposition) method, and the silicon oxide film at the upper layer is formed by the CVD method or the ISSS oxidation method. After the silicon oxide film at the lower layer is formed, before forming the silicon nitride film, the silicon oxide film is nitrided in a high-temperature atmosphere including nitrogen oxides such as $N_2O$, thereby segregating nitrogen at an interface between the silicon oxide film and the substrate 1 (p-type well 2). By performing the nitriding processing, hot-carrier resistance of the control transistor and the memory transistor included in the memory cell is improved, as a result, characteristics of the memory cell (such as a rewriting characteristic) are improved.

Before the process of forming the charge storage layer 16 after the control gate 8 is formed, it is preferable that an impurity for adjusting a threshold voltage of the control transistor or an impurity for adjusting a threshold voltage of the memory transistor is ion-implanted into the p-type well 2 in the memory array region. Accordingly, the threshold voltages in the control transistor and the memory transistor can be optimized.

Next, an electrode material film 9A made of an n-type polycrystalline silicon film or the like is formed over the substrate 1 by the CVD method. The so-called doped polysilicon film (n-type polycrystalline silicon film) in which an impurity is introduced at the time of deposition can reduce electric resistance, compared with a case in which the impurity is ion-implanted after the deposition).

Figure 13:
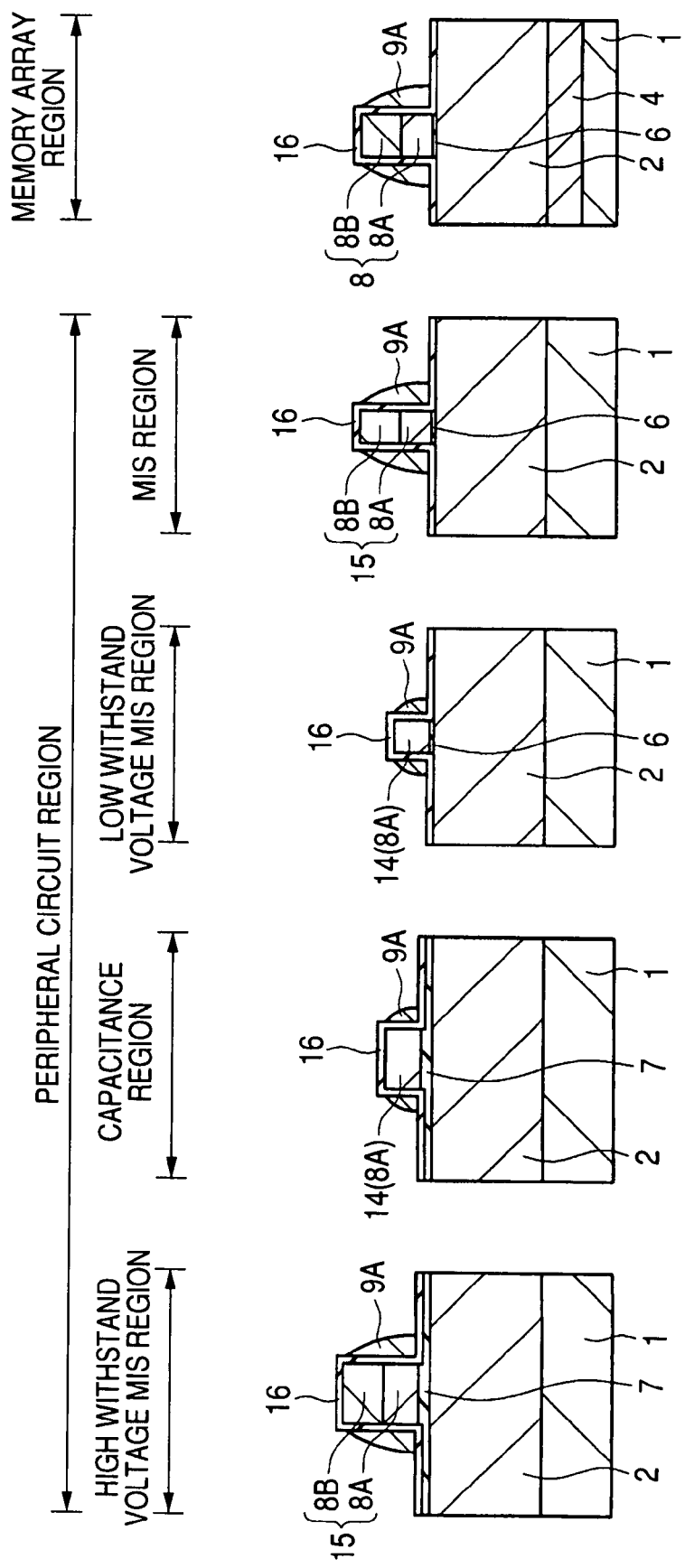
FIG. 13 is a cross-sectional view of relevant parts schematically showing the semiconductor device in a manufacturing process continued from FIG. 12.

Subsequently, as shown in FIG. 13, the electrode material film 9A is anisotropically etched to allow the electrode material film 9A made of the n-type polycrystalline silicon film or the like at respective both sidewalls of the control gate 8, gate electrodes 14 and 15 in the peripheral circuits. The impurity (phosphorous or arsenic) concentration of the n-type polycrystalline silicon film is approximately $1\times10^{20}/cm^3$ to $6\times10^{20}/cm^3$.

Figure 14:
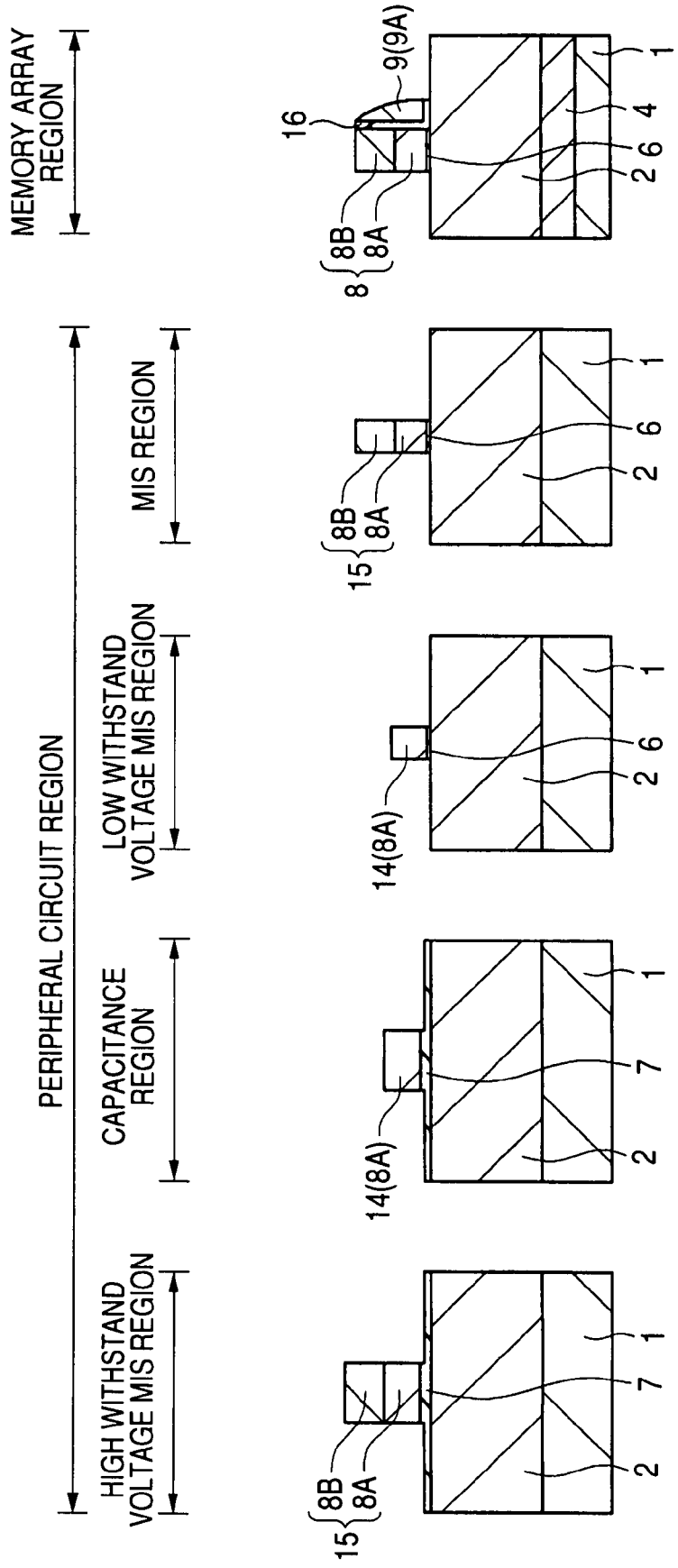
FIG. 14 is a cross-sectional view of relevant parts schematically showing the semiconductor device in a manufacturing process continued from FIG. 13.

Subsequently, as shown in FIG. 14, the electrode material film 9A made of the n-type polycrystalline silicon film or the like is etched, using a photoresist film (not shown) covering the memory gate forming region as a mask. Accordingly, a memory gate 9 including the electrode material film 9A is formed at one sidewall of the control gate 8.

The gate length of the memory gate 9 formed at the sidewall of the control gate 8 is approximately 80 nm, the aspect ratio of which (ratio of height (thickness) with respect to the gate length) is larger than 1. In the embodiment, since the memory gate 9 is formed after the control gate 8 is formed, the memory gate 9 having high aspect ratio in which the gate length is further smaller than the control gate 8 can be formed easily.

Next, the three layers of insulating films forming the charge storage layer 16 are etched using hydrofluoric acid and phosphorous acid. Accordingly, the charge storage layer 16 formed at unnecessary regions is removed, allowing the charge storage layer 16 to remain only at one sidewall of the control gate 8 and under the memory gate 9.

Figure 15:
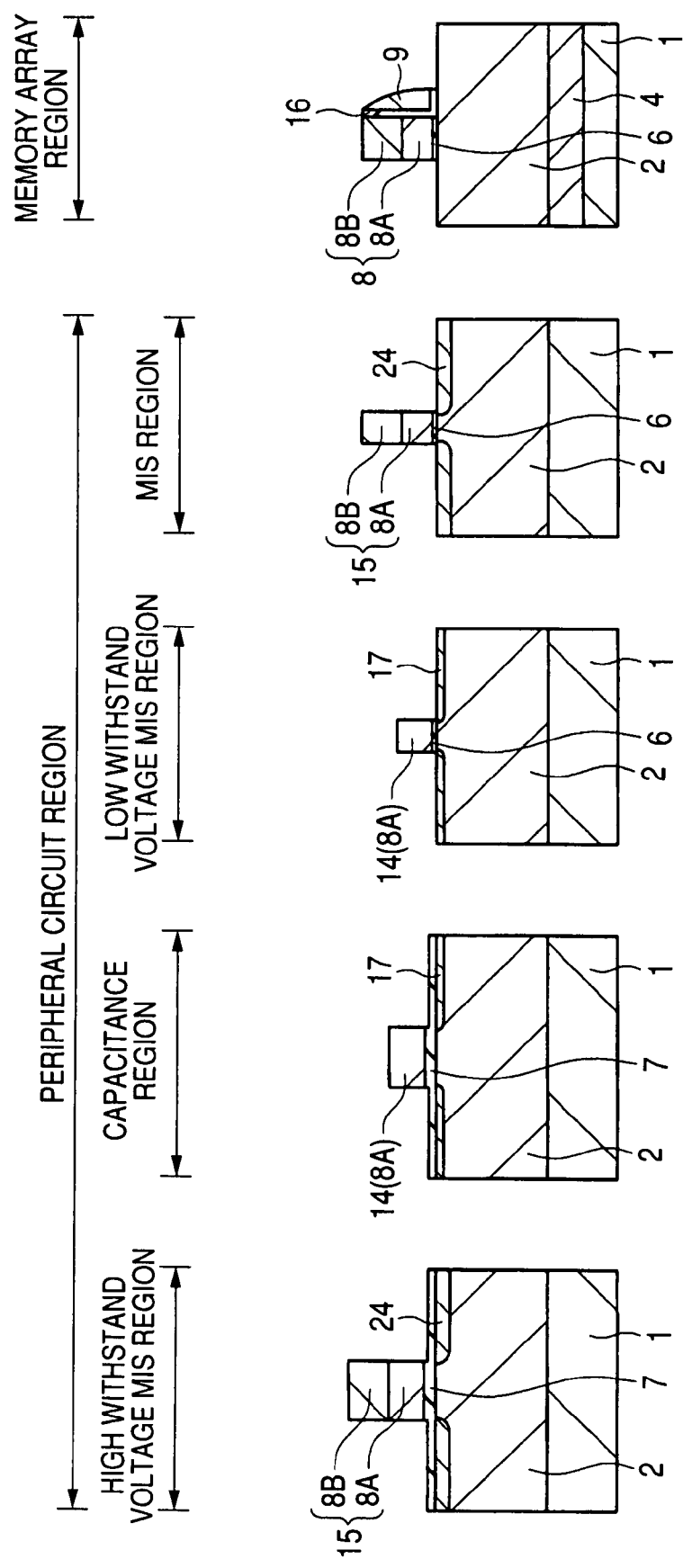
FIG. 15 is a cross-sectional view of relevant parts schematically showing the semiconductor device in a manufacturing process continued from FIG. 14.

Subsequently, as shown in FIG. 15, an n⁻type semiconductor region 17 is formed by ion-implanting an impurity (phosphorous or arsenic) into the low withstand voltage MIS region and the capacitance region using the gate electrodes 14 and the photoresist film (not shown) as masks. The n⁻type semiconductor region 17 is an extension region for allowing the n-channel low withstand voltage MISFET and the MIS capacitance to be the LDD structure.

Next, an n⁻type semiconductor region 24 is formed by ion-implanting an impurity (phosphorous or arsenic) into the high withstand voltage MIS region and the MIS region, using the gate electrodes 15 and the photoresist film (not shown) as masks. The n⁻type semiconductor region 24 is an extension region for allowing the n-channel high withstand voltage MISFET and the MISFET whose source/drain regions are specified for high withstand voltage to be the LDD structure. At the same time of the process of forming the n⁻type semiconductor region 24, an impurity (phosphorous or arsenic) is ion-implanted into the electrode material film 8B made of the undoped silicon film, thereby forming the electrode material film 8B made of the impurity-doped n-type silicon film.

The ion-implantation for forming the n⁻type semiconductor region 17 and the n⁻type semiconductor region 24 may be performed before removing the charge storage layer 16, however, it is advantageous to perform ion-implantation after removing the charge storage layer 16 for forming shallow pn-junction.

Figure 16:
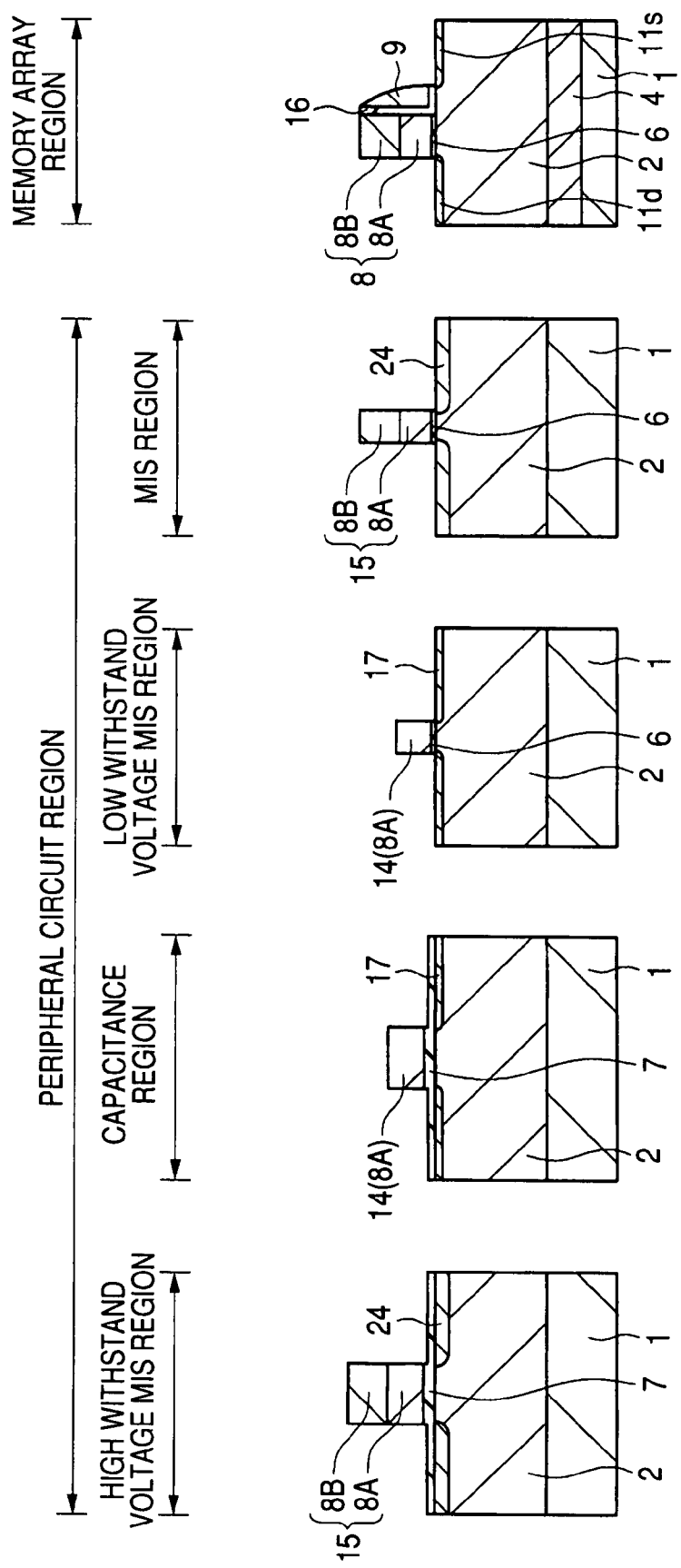
FIG. 16 is a cross-sectional view of relevant parts schematically showing the semiconductor device in a manufacturing process continued from FIG. 15.

Subsequently, as shown in FIG. 16, n⁻type semiconductor regions 11d and 11s are formed by ion-implanting an impurity (phosphorous or arsenic) into the memory array region, using the split gate including the control gate 8 and the memory gate 9 and the photoresist film (not shown) as masks. The n⁻type semiconductor regions 11d and 11s are extension regions for allowing the memory cell to be the LDD structure.

Figure 19:
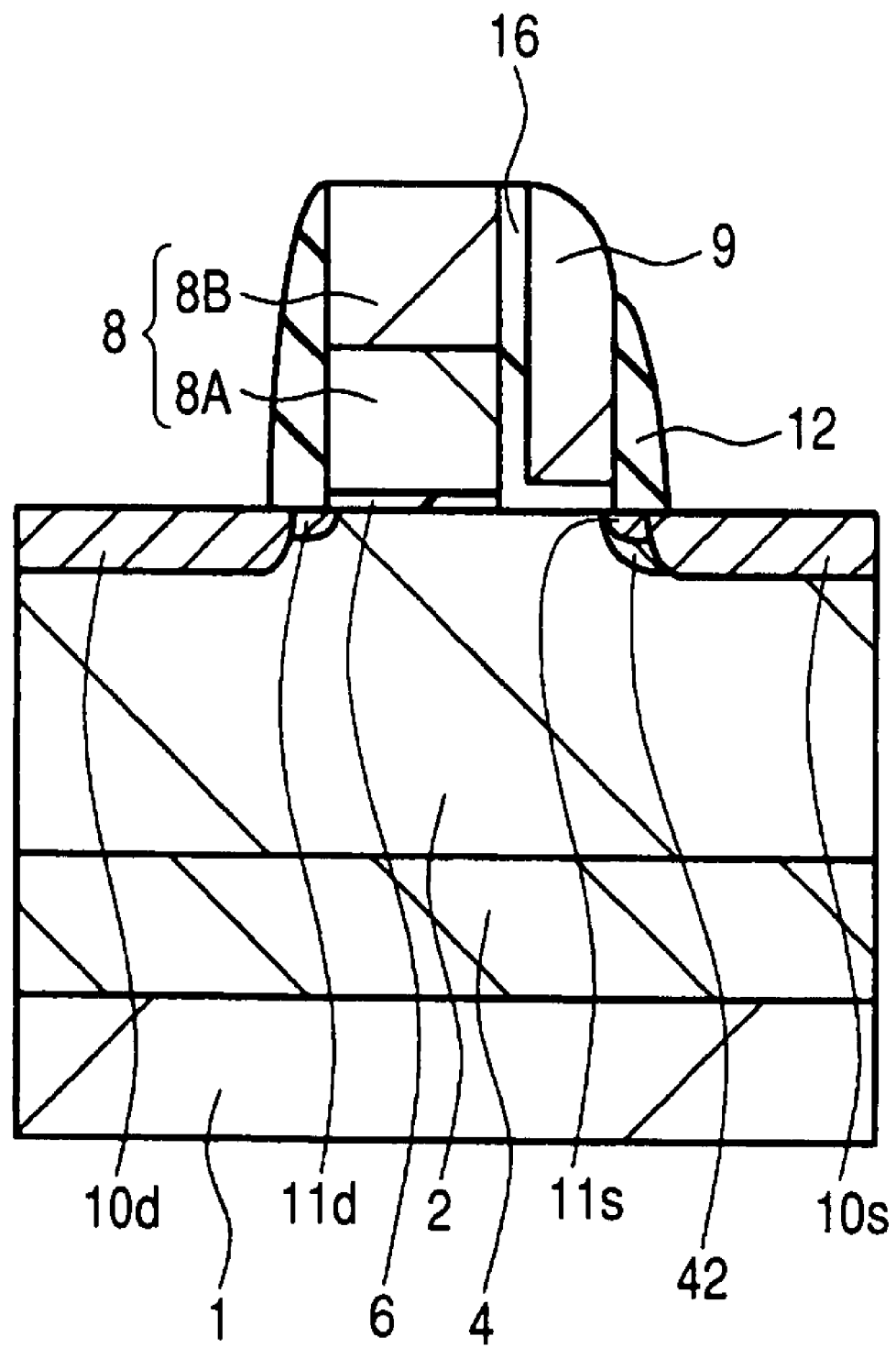
FIG. 19 is a cross-sectional view of relevant parts schematically showing a nonvolatile memory in which a halo region is provided.
Figure 20:
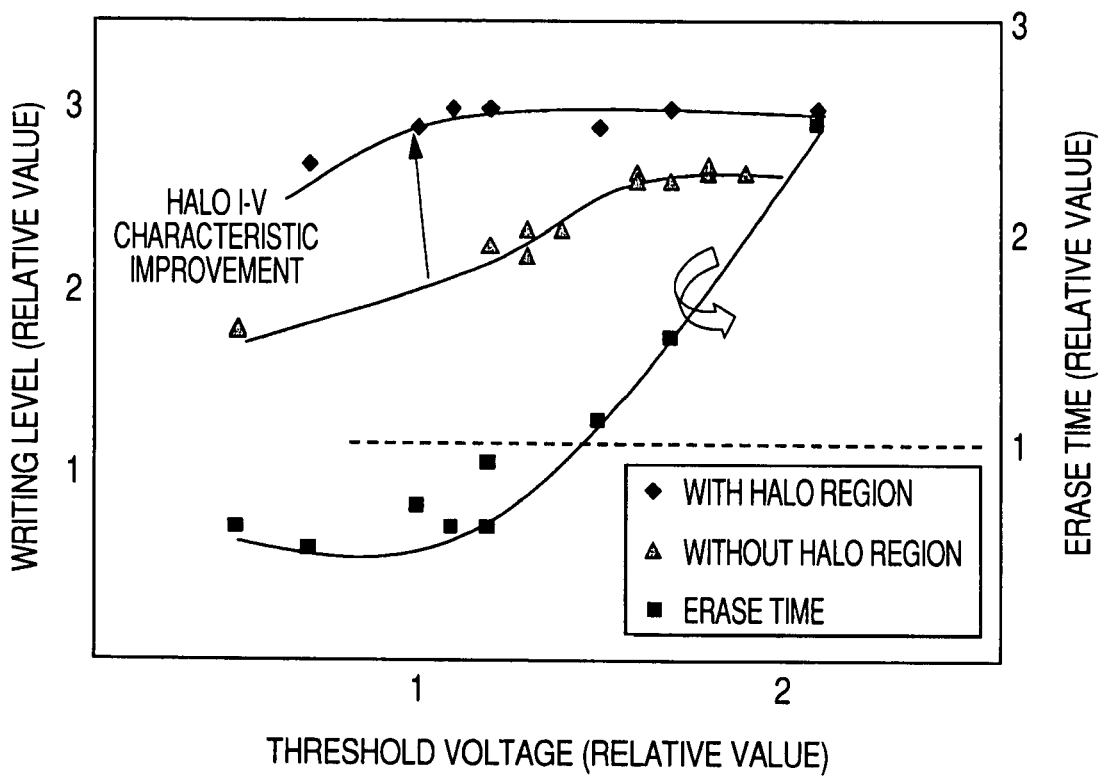
FIG. 20 is an explanatory chart showing the nonvolatile memory in which the halo region is provided.

After that, it is preferable to form a p-type semiconductor region 42 is formed by ion-implanting (halo implantation) a p-type impurity (boron or boron difluoride) into the n⁻type semiconductor region 11s as shown in FIG. 19. In this case, the p-type semiconductor region 42 is formed under the n⁻type semiconductor region 11s at the source side, functioning as a region (halo region) for suppressing short channel effect of the memory cell. In the case having the halo region in which the p-type semiconductor region 42 is formed such as the memory cell MC shown in FIG. 19, a writing level (electric current level) with respect to the threshold voltage of the memory cell MC is improved as compared with a case not having the halo region in which the p-type semiconductor region 42 is not formed, as shown in FIG. 20. Thus, by adding the halo region to the source of the memory cell MC, an electric field at a source end is increased and the injection of channel hot electrons is increased, as well as the short channel effect is improved and a subthreshold coefficient is decreased, which improves writing speed. In FIG. 20, erase time with respect to the threshold voltage of the memory cell MC is shown. That is, it is possible to improve the writing level without lowering the level of erase time by forming the p-type semiconductor region below the n⁻type semiconductor region 11s at the source side.

Figure 17:
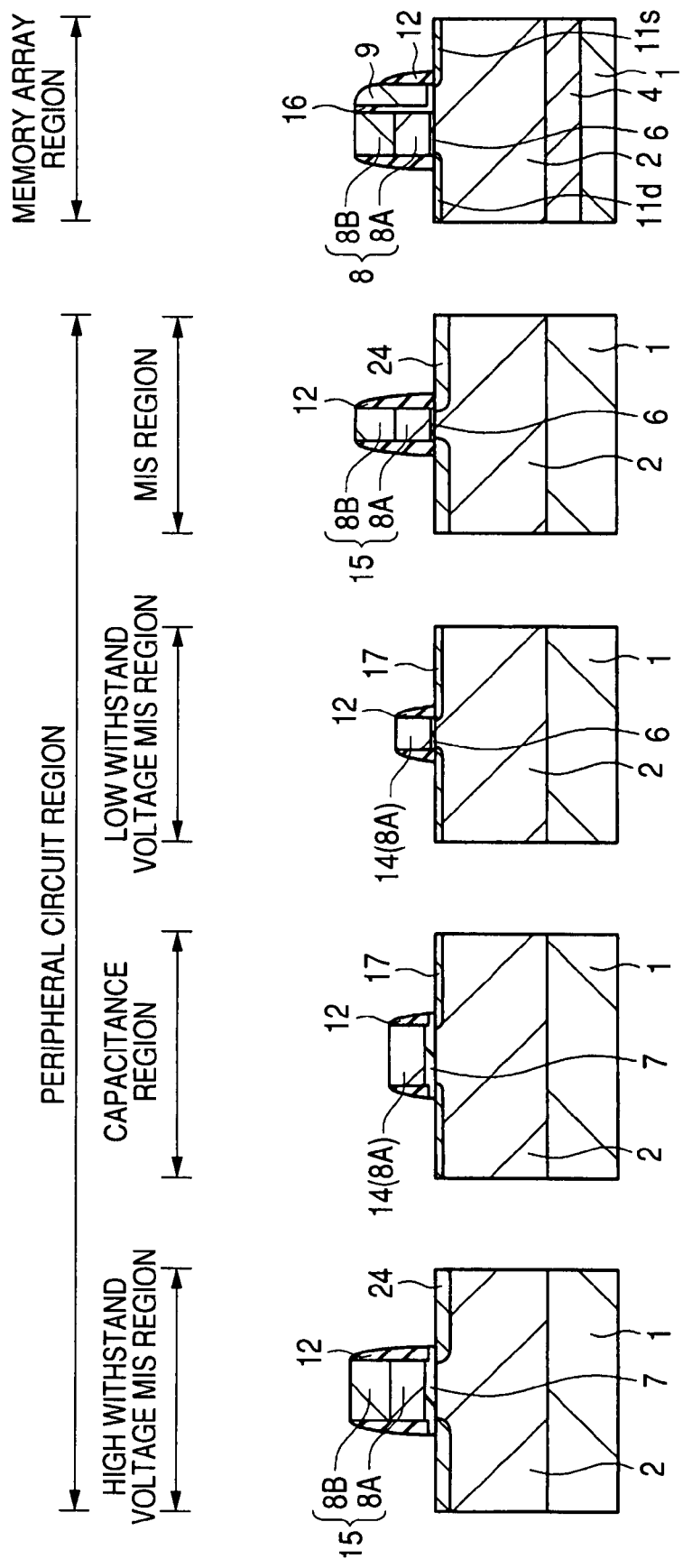
FIG. 17 is a cross-sectional view of relevant parts schematically showing the semiconductor device in a manufacturing process continued from FIG. 16.

Subsequently, as shown in FIG. 17, a sidewall spacer 12 is formed at each one sidewall of the control gate 8 and the memory gate 9 formed in the memory array region, and the sidewall spacer 12 is formed at respective both sides of the gate electrodes 14 and the gate electrodes 15 in the peripheral circuit region. The sidewall spacer 12 is formed by etching back (anisotropic etching) the insulating film made of the silicon oxide film or the like deposited over the substrate 1 by the CVD method.

Figure 18:
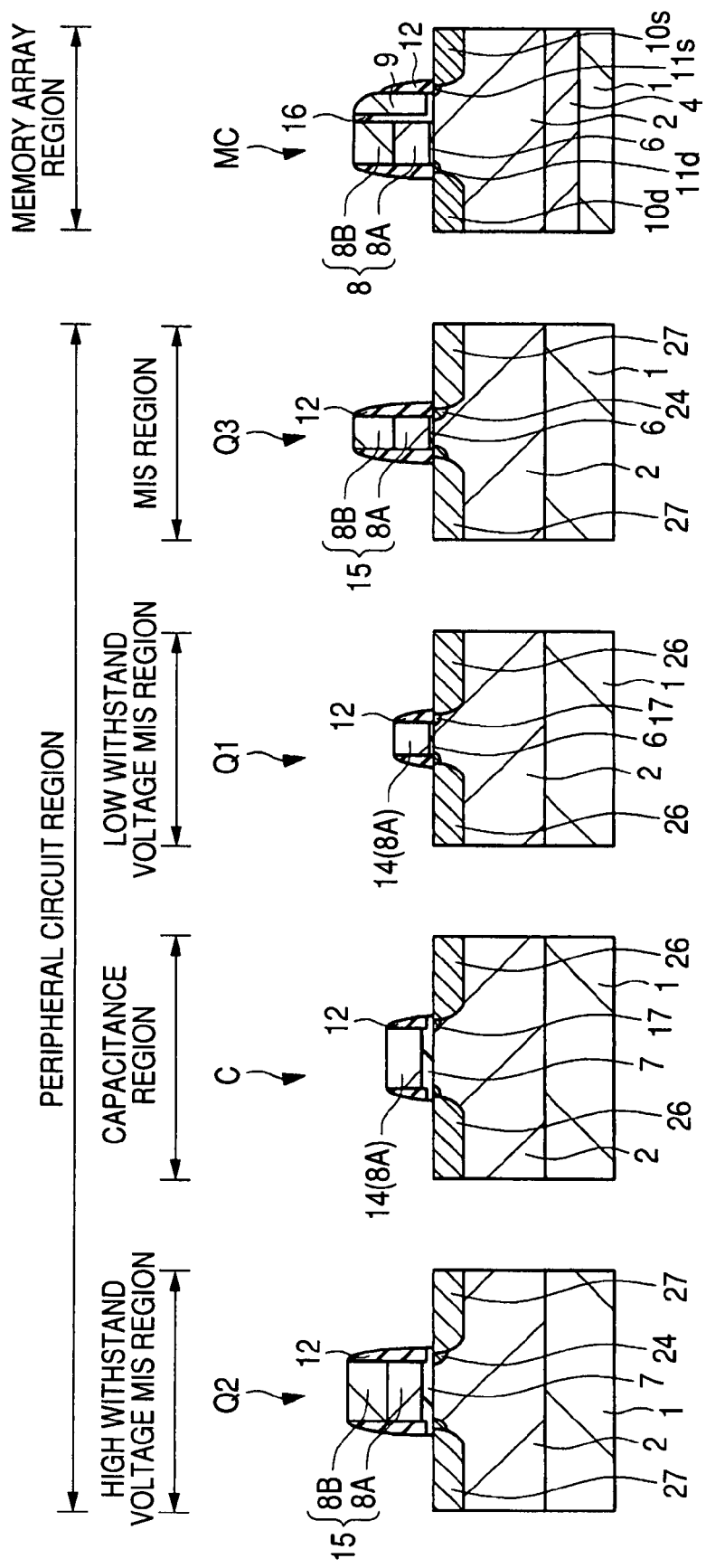
FIG. 18 is a cross-sectional view of relevant parts schematically showing the semiconductor device in a manufacturing process continued from FIG. 17.

Subsequently, as shown in FIG. 18, an impurity (phosphorous or arsenic) is ion-implanted into the memory array region and the peripheral circuit region, using the photoresist film (not shown) as a mask. This ion-implantation has a higher dose amount of the impurity (approximately $1\times10^{13}/cm^2$) as well as higher implantation energy (approximately 40 KeV) as compared with the ion implantation for forming the extension regions (n⁻type semiconductor regions 11s, 11d, 17 and 24).

According to the above, in the memory array region, an n⁺type semiconductor region (drain region) 10d and an n⁺type semiconductor region (source region) 10s are formed in the vicinity of the split gate, using the split gate and the sidewall spacer 12 as masks to complete the memory cell MC. In the low withstand voltage MIS region and the capacitance region, an n⁺type semiconductor region 26 is formed in the vicinity of the gate electrode 14, using the gate electrodes 14 and the sidewall spacer 12 as masks to complete the n-channel type low withstand voltage MISFET (Q1) and the MIS capacity (C). In the high withstand voltage MIS region and the MIS region, an n⁺type semiconductor region 27 is formed, using the gate electrodes 15 and the sidewall spacer 12 as masks to complete the n-channel type high withstand voltage MISFET (Q2) and the MISFET (Q3) whose source/drain regions are specified for the high withstand voltage.

In the memory array region, the n⁻type semiconductor regions 11s, 11d are formed over the principal surface of the substrate 1 by the ion implantation of an impurity (phosphorous or arsenic), using the split gate including the control gate 8 and the memory gate 9 as a mask. The sidewall spacer 12 is formed at sidewalls of the split gate, and the n⁺type semiconductor regions 10s and 10d having higher impurity concentration than the n⁻type semiconductor regions 11s, 11d are formed over the principal surface of the substrate 1 by the ion implantation of an impurity (phosphorous or arsenic) using the split gate and the sidewall spacer 12 as masks. Since the ratio (aspect ratio) of height (thickness) of the memory gate 9 with respect to the gate length of the memory gate 9 is larger than 1, the width under the sidewall spacer 12 (the size along the substrate 1) formed in the above process is secured. Therefore, occurrence of leakage (junction leakage) at a junction between the n⁺type semiconductor regions 10s, 10d formed in the above process and the p-type well 2 can be suppressed.

Since an impurity is implanted also into the control gate 8 and the gate electrodes 15 in the ion implantation process for forming the n$^+$type semiconductor regions 10s, 10d and 27, the electrode material film 8B forming the control gate 8 and the gate electrodes 15 becomes a low-resistance n-type silicon film from the undoped silicon film. Accordingly, a process of ion-implanting the impurity into the electrode material film 8B forming the control gate 8 and the gate electrodes 15 and a photomask to be used in the process can be omitted. However, for example, the impurity is ion-implanted also into the n-cannel type low withstand voltage MISFET (Q1) and the like, therefore, it is necessary to consider characteristic variations thereof.

An impurity is implanted also into the control gate 8 and the memory gate 9 in the ion implantation process for forming the n$^+$type semiconductor regions 10s, 10d. This ion implantation has a higher dose amount of the impurity as well as higher implantation energy as compared with the ion implantation for forming the n$^-$type semiconductor regions 11s, 11d. Accordingly, in the case that the height (thickness) of the control gate 8 or the memory gate 9 is not sufficient, when the impurity implanted into the control gate 8 or the memory gate 9 penetrates the gate insulating film 6 or the charge storage layer 16 under these gates to reach the surface of the p-type well 2, the threshold voltage of the control transistor or the memory transistor varies.

As described above, as the gate electrode (gate length) is miniaturized, it is necessary to make the gate electrode thinner for securing the ratio (aspect ratio) of height (thickness) of the gate electrode with respect to the gate length. Consequently, in the semiconductor device including the memory array and peripheral circuits thereof shown by the state of the embodiment, thickness of the gate electrode 14 in the low withstand voltage MISFET (Q1) is made to be thinner for the miniaturization.

Figure 21:
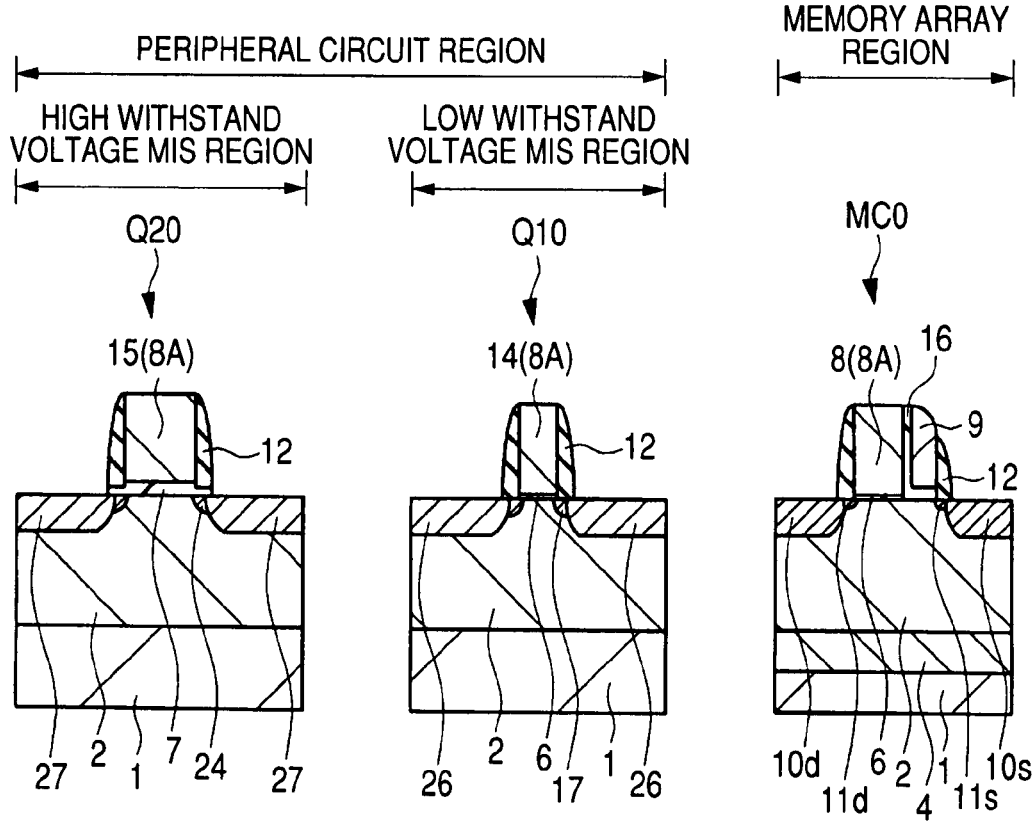
FIG. 21 is a cross-sectional view of relevant parts schematically showing a semiconductor device which has been considered by the inventors.
Figure 22:
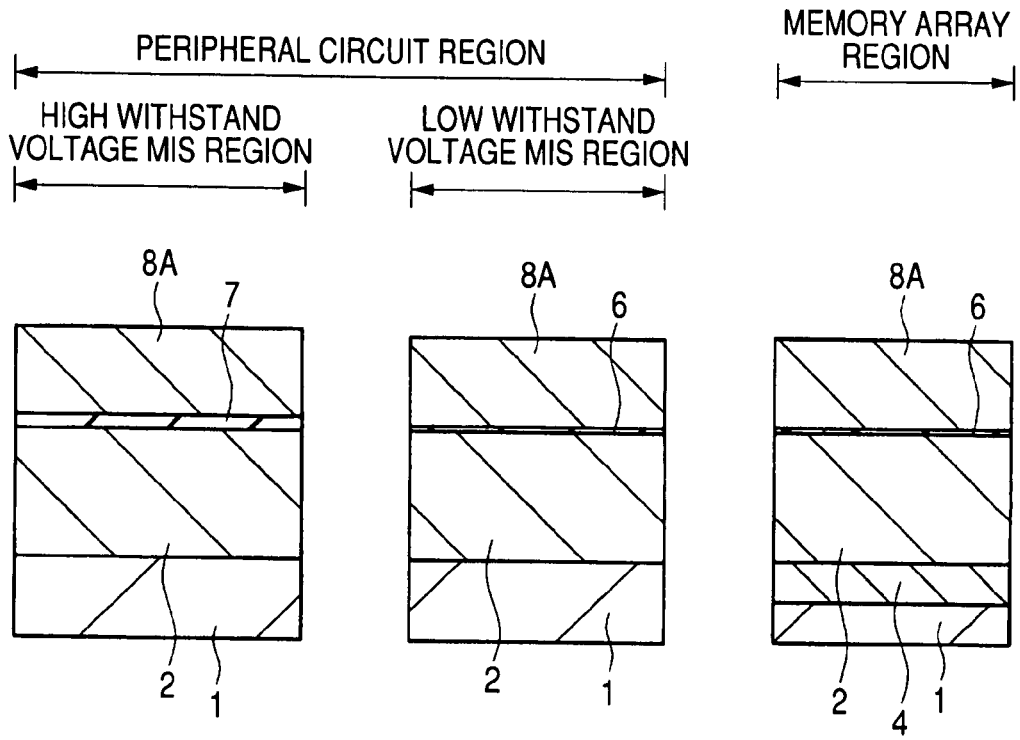
FIG. 22 is a cross-sectional view showing the semiconductor device in a manufacturing process which has been considered by the inventors.

However, for example, in the case that the gate electrode 14 in the low withstand voltage MISFET (Q10) and the control gate 8 of the memory cell MC0 are formed at the same time such as in the technology described by the inventors with reference to FIG. 21 and FIG. 22, when the gate electrode 14 is made to be thin, the control gate 8 is also made to be thin. In this case, when the impurity is implanted also into the control gate 8 or the memory gate 9 and penetrates the gate insulating film 6 or the charge storage layer 16 under these gates to reach the surface of the p-type well 2 in the ion implantation process for forming the n$^+$type semiconductor regions 10s, 10d, the threshold voltage of the control transistor or the memory transistor varies.

In the invention, the gate electrode 14 is made to be a single layer structure including the electrode material film 8A of the control gate 8 to be miniaturized, as well as the control gate 8 is made to be a multilayer structure including the electrode material film 8A and the electrode material film 8B to allowing the height (thickness) thereof to be higher than the gate electrode 14, thereby preventing the impurity from penetrating at the time of ion implantation. Accordingly, the threshold voltage variations can be suppressed in the nonvolatile memory, and occurrence of problems such as malfunctions of the nonvolatile memory can be prevented.

Subsequently, after a silicon nitride film 20 and the silicon oxide film 21 are deposited over the substrate 1 by the CVD method, a data line DL is formed over the silicon oxide film 21 in the memory array region, and wiring at the same layer as the data line DL is formed over the peripheral circuit region (refer to FIG. 1). After that, a plurality of wirings are formed at an upper layer of the data line DL and the wiring, sandwiching an interlayer insulating film therebetween, through not shown.

It is also possible that the control gate 8 and the memory gate 9 are made to be low resistance by forming a silicide layer including cobalt silicide and the like over the surface of the control gate 8, the memory gate 9, the source region 10s and the drain region 10d in the memory cell MC before the process of forming the silicon nitride film 20 over the substrate 1. Similarly, it is possible to form the silicide layer including cobalt silicide and the like over the surface of the gate electrodes 14, 15 and the n$^+$type semiconductor regions 26, 27 in the peripheral circuits.

For example, in the memory cell MC, another sidewall spacer is formed through the sidewall spacer 12 at the sidewalls of the split gate, and the silicide layer whose one end is arranged in the vicinity of another sidewall spacer is formed over the n$^+$type semiconductor regions 10s, 10d, namely, the silicide layer is not formed over the n$^-$type semiconductor regions 11s, 11d. Since the ratio (aspect ratio) of the thickness of the memory gate 9 with respect to the gate length of the memory gate 9 is larger than 1, the width (the size along the substrate 1) under the sidewall spacer 12 formed in the above process is secured, further, the width under another sidewall spacer formed through the sidewall spacer 12 is also secured. Consequently, occurrence of leakage (junction leakage) at a junction between the silicide layer formed over the n$^+$type semiconductor regions 10s, 10d and the p-type well 2 can be suppressed.

The silicide layer of the memory cell MC is formed, for example, by the following processes. First, after a silicon oxide film is formed so as to cover the principal surface of the substrate 1, sidewalls and the top surface of the split gate, the sidewall spacer is formed at the sidewalls of the split gate by etching back the silicon oxide film. Next, a metal film (for example, a titanium film) is formed so as to cover the principal surface of the substrate 1, sidewalls and the top surface of the split gate, and a contact portion of the metal film and the n$^+$type semiconductor regions 10s, 10d is silicided, thereby forming the silicide layer (for example, a titanium silicide film) whose one end is arranged in the vicinity of the sidewall spacer. After that, the unreacted metal film is removed.

As described above, the invention made by the inventors has been specifically explained based on the embodiment, and it goes without saying that the invention is not limited to the embodiment and can be variously modified within the scope not departing from the gist thereof.

For example, in the embodiment, the case in which the invention is applied to five kinds of semiconductor elements, namely, the memory cell, the low withstand voltage MISFET, the high withstand voltage MISFET, the MISFET whose source/drain regions are high withstand voltage and the MIS capacitance has been explained, however, the invention is applicable to a semiconductor device having a plurality of thicknesses of the gate insulating film and a plurality of heights of the gate electrode respectively.

In the above embodiment, the case in which the n-channel type MISFET is adopted has been explained, however, for example, a case in which a p-channel type MISFET is adopted is also preferable. At this time, the electrode material film 8A made of the undoped silicon film may be the p-type silicon film. For example, an impurity (boron or boron difluoride) is ion-implanted into the undoped silicon film 8A, masking predetermined regions with a photoresist film by using the photolithography technology, thereby changing regions not masked in the electrode material film 8A made of the undoped silicon film to the p-type silicon film. Accordingly, it is possible to perform n-type or p-type predoping, as a result, device characteristics can be improved efficiently.

The invention is widely used to manufacturing industries manufacturing semiconductor devices.

What is claimed is:

1. A method of manufacturing a semiconductor device which has a first MISFET including a first gate formed over a principal surface of a first region of a semiconductor substrate through a first gate insulating film, a second MISFET including a second gate which is higher than the first gate, formed over the principal surface of a second region of the semiconductor substrate through a second gate insulating film which is thicker than the first gate insulating film and a memory cell including a control gate formed over the principal surface of a third region of the semiconductor substrate through a third insulating film, a charge storage layer in which one part thereof is formed at one sidewall of the control gate as well as the other part thereof is formed over the principal surface of the semiconductor substrate, and a memory gate which is electrically separated from the control gate through the one part of the charge storage layer, as well as electrically separated from the semiconductor substrate through the other part of the charge storage layer, forming a split gate together with the control gate, the method comprising the steps of:

(a) after forming the second gate insulating film over the principal surface of the semiconductor substrate, removing the second gate insulating film in the first region and the third region;

(b) forming the first and the third gate insulating films over the principal surface of the semiconductor substrate in the first region and the third region at the same time, as well as making a film thickness of the second gate insulating film in the second region thick;

(c) after forming a first electrode film over the first, second and third insulating films and forming a cap insulating film over the first electrode material film, removing the cap insulating film in the second region and the third region and forming a second electrode material film over the first electrode material film;

(d) forming the second gate including the first electrode material film and the second electrode material film by patterning the second electrode material film and the first electrode material film in the second region, while protecting the first electrode material film in the first region with the cap film, as well as forming the control gate including the first electrode material film and the second electrode material film by patterning the second and first electrode material films in the third region; and (e) after removing the cap insulating film in the first region, forming the first gate including the first electrode material film by patterning the first electrode material film in the first region.

2. The method of manufacturing the semiconductor according to claim 1, further comprising the steps of:

(f) allowing the third gate insulating film to remain under the control gate by patterning the third insulating film in the third region, using the control gate as a mask; and (g) after forming an ONO film to be the charge storage layer so as to cover the principal surface of the semiconductor substrate, sidewalls and a top surface of the control gate and forming a third electrode material film over the ONO film, forming a memory gate which includes the third electrode material film and forms the split gate together with the control gate at one sidewall of the control gate by anisotropically etching the third electrode material film, and further, removing the ONO film not touching the memory gate, and wherein the ratio of height of the memory gate with respect to the gate length of the memory gate is allowed to be larger than 1 by the anisotropic etching in the process (g).

3. The method of manufacturing the semiconductor device according to claim 2, further comprising the steps of:

(h) forming a first semiconductor region in the vicinity of the split gate by ion-implanting an impurity into the principal surface of the semiconductor substrate, using the split gate as a mask;

(i) after forming an insulating film so as to cover the principal surface of the semiconductor substrate, sidewalls and a top surface of the split gate, forming a sidewall including the insulating film at sidewalls of the split gate by etching back the insulating film; and (j) forming a second semiconductor region having higher impurity concentration than the first semiconductor region in the vicinity of the split gate by ion-implanting an impurity into the principal surface of the semiconductor substrate, using the split gate and the sidewall as masks.

4. The method of manufacturing the semiconductor device according to claim 3, in which the semiconductor substrate is made of a silicon substrate, further comprising the steps of:

(k) after forming an silicon oxide film so as to cover the principal surface of the silicon substrate, sidewalls and a top surface of the split gate, forming a spacer including the silicon oxide film at the sidewalls of the split gate through the sidewall by etching back the silicon oxide film;

(l) forming a metal film so as to cover the principal surface of the silicon substrate, sidewalls and the top surface of the split gate, and forming a silicide layer one end of which is arranged in the vicinity of the spacer by siliciding a contact portion between the metal film and the second semiconductor region; and (m), after the step (l), removing an unreacted metal film.

* * * * *